(12) United States Patent
Takaishi

(10) Patent No.: US 9,570,447 B2
(45) Date of Patent: Feb. 14, 2017

(54) SEMICONDUCTOR DEVICE AND PRODUCTION METHOD THEREFOR

(71) Applicant: PS4 Luxco S.a.r.l., Luxembourg (LU)

(72) Inventor: Yoshihiro Takaishi, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/762,132

(22) PCT Filed: Jan. 22, 2014

(86) PCT No.: PCT/JP2014/051191
§ 371 (c)(1),
(2) Date: Jul. 20, 2015

(87) PCT Pub. No.: WO2014/115744
PCT Pub. Date: Jul. 31, 2014

(65) Prior Publication Data
US 2015/0357337 A1    Dec. 10, 2015

(30) Foreign Application Priority Data
Jan. 23, 2013   (JP) ................. 2013-010131

(51) Int. Cl.
*H01L 27/108*   (2006.01)
*H01L 29/78*    (2006.01)
(Continued)

(52) U.S. Cl.
CPC ... *H01L 27/10814* (2013.01); *H01L 21/26513* (2013.01); *H01L 27/0207* (2013.01); *H01L 27/108* (2013.01); *H01L 27/10823* (2013.01); *H01L 27/10876* (2013.01); *H01L 27/10894* (2013.01); *H01L 29/66545* (2013.01); *H01L 29/66666* (2013.01); *H01L 29/7827* (2013.01)

(58) Field of Classification Search
CPC .......... H01L 21/26513; H01L 27/0207; H01L 27/108; H01L 27/10814; H01L 27/10823; H01L 27/10876; H01L 27/10894; H01L 29/66545; H01L 29/66666; H01L 29/7827
USPC ......... 257/296, 124, 329, 330; 438/268, 242
See application file for complete search history.

(56) References Cited

U.S. PATENT DOCUMENTS 5,416,350 A    5/1995   Watanabe
7,326,611 B2 *  2/2008  Forbes ............. H01L 27/10876
                                                    257/E21.629
(Continued)

OTHER PUBLICATIONS

Application No. PCT/JP2014/051191, International Search Report, Apr. 8, 2014.

*Primary Examiner* — Mohammed Shamsuzzaman
(74) *Attorney, Agent, or Firm* — Kunzler Law Group, PC

(57) ABSTRACT

One semiconductor device includes first to third gate electrodes arranged inside a first active region and embedded in first to third trenches extending in a first direction, a first semiconductor pillar positioned between the first and second trenches, a second semiconductor pillar positioned between the second and third trenches, a first vertical transistor having the first and second gate electrodes as the double gate electrodes therefor, and a second vertical transistor having the second and third gate electrodes as the double gate electrodes therefor. The second gate electrode is shared by the first vertical transistor and the second vertical transistor.

7 Claims, 18 Drawing Sheets

(51) Int. Cl.
*H01L 29/66* (2006.01)
*H01L 21/265* (2006.01)
*H01L 27/02* (2006.01)

(56) References Cited

U.S. PATENT DOCUMENTS

| | | | |
|---|---|---|---|
| 7,391,070 B2* | 6/2008 | Juengling | H01L 27/10814 257/296 |
| 7,696,567 B2* | 4/2010 | Haller | H01L 21/823487 257/302 |
| 8,492,814 B2* | 7/2013 | Fujimoto | H01L 21/76897 257/296 |
| 8,883,593 B2* | 11/2014 | Nojima | H01L 27/10876 257/302 |
| 8,987,796 B2* | 3/2015 | Mikasa | H01L 27/108 257/296 |
| 9,136,227 B2* | 9/2015 | Takaishi | H01L 23/58 |
| 2007/0051994 A1* | 3/2007 | Song | H01L 27/108 257/296 |
| 2007/0075359 A1* | 4/2007 | Yoon | H01L 27/10876 257/329 |
| 2007/0080385 A1* | 4/2007 | Kim | H01L 27/10876 257/296 |
| 2008/0124867 A1* | 5/2008 | Brown | H01L 21/84 438/268 |
| 2010/0044749 A1* | 2/2010 | Kitamura | H01L 29/66666 257/124 |
| 2011/0006360 A1* | 1/2011 | Ikebuchi | H01L 27/10876 257/329 |
| 2011/0143508 A1* | 6/2011 | Kim | H01L 27/10823 438/270 |
| 2011/0183488 A1* | 7/2011 | Takaishi | H01L 21/76816 438/381 |
| 2012/0261733 A1* | 10/2012 | Oyu | H01L 27/10876 257/296 |
| 2013/0105872 A1* | 5/2013 | Kim | H01L 27/10823 257/296 |
| 2014/0048860 A1* | 2/2014 | Mikasa | H01L 27/108 257/296 |

* cited by examiner

A

B

SEMICONDUCTOR DEVICE AND PRODUCTION METHOD THEREFOR

TECHNICAL FIELD

The present invention relates to a semiconductor device and a method for producing same.

BACKGROUND

Vertical transistors are conventionally used as semiconductor devices which are able to be miniaturized. In a vertical transistor, a gate insulating film and a gate electrode are provided on the side surface of a semiconductor pillar extending perpendicularly from the main surface of a semiconductor substrate, and a source and drain are provided above and below the pillar.

A vertical transistor makes it possible to achieve a fully depleted semiconductor device by narrowing the pillar diameter to a certain extent. In a fully depleted semiconductor device, the S coefficient is small and variations in the threshold voltage $V_t$ can be reduced. As a result, it is possible to achieve a low-voltage/high-performance semiconductor device. Furthermore, it is possible to reduce the area occupied because of a two-dimensional structure, and this is also very advantageous for making the device more compact.

Patent Document 1 (JP 2012-89772 A) describes a semiconductor device employing a vertical transistor. In that semiconductor device, a dummy pillar is provided in the vicinity of a semiconductor pillar, and a gate electrode is provided continuously on the side surfaces of the semiconductor pillar and the dummy pillar. Furthermore, a gate contact is formed on the gate electrode on the side surface of the dummy pillar.

PATENT DOCUMENTS

Patent Document 1: JP 2012-89772 A

SUMMARY OF THE INVENTION

Problem to be Solved by the Invention

A vertical transistor is conventionally used in the peripheral circuit region of a DRAM (Dynamic Random Access Memory). The semiconductor pillar of this vertical transistor is formed by processing a semiconductor substrate in such a way as to produce a substantially square shape when seen in plan view. The step of forming the semiconductor pillar is therefore poorly compatible with the step of forming the memory cell region of the DRAM and it is necessary to provide the step of forming the semiconductor pillar separately from the step of forming the memory cell region. In particular, the miniaturization of semiconductor devices has progressed, and when the step of forming semiconductor pillar is separately provided, this markedly increases the production costs, which is a considerable drawback.

Furthermore, the gate electrode of a vertical transistor is formed by forming a conductive film on a semiconductor substrate and then etching back the structure in order to leave the conductive film on the side surface of the semiconductor pillar. At this point, any gate spacing may be assumed in accordance with the contact with a lower diffusion layer of the vertical transistor and the distance from an element isolation region. It is therefore difficult to control the uniformity of the etching back of the conductive film for the gate electrode. As a result, variations are produced in the height of the upper surface of the conductive film (gate electrode) after etching back, and this causes a reduction in the semiconductor characteristics of the vertical transistor.

Means for Solving the Problem

One mode of embodiment relates to a semiconductor device characterized in that it comprises:
a first active region which is disposed inside a semiconductor substrate;
a first trench which is disposed inside the first active region and has a first side surface and a second side surface extending in parallel in a first direction;
a second trench which is disposed inside the first active region and has a third side surface and a fourth side surface extending in parallel in the first direction;
a third trench which is disposed inside the first active region and has a fifth side surface and a sixth side surface extending in parallel in the first direction;
a first gate electrode embedded in the first trench;
a second gate electrode embedded in the second trench;
a third gate electrode embedded in the third trench;
a first semiconductor pillar which is positioned between the first trench and the second trench and shares the second side surface the third side surface; and
a second semiconductor pillar which is positioned between the second trench and the third trench and shares the fourth side surface and the fifth side surface,
the first semiconductor pillar forming a first vertical transistor in which the first gate electrode and the second gate electrode form a double gate electrode,
the second semiconductor pillar forming a second vertical transistor in which the second gate electrode and the third gate electrode form a double gate electrode, and
the second gate electrode being shared by the first vertical transistor and the second vertical transistor.

Another mode of embodiment relates to a semiconductor device having a first region and a second region, characterized in that the first region is provided with:
a first active region comprising a semiconductor;
three or more trenches A extending in a first direction inside the first active region; and
a plurality of vertical transistors comprising: two first gate insulating films and two gate electrodes A provided in succession on the inner surface of adjacent trenches A, a semiconductor pillar A which is formed by the first active region positioned between adjacent trenches A, an upper diffusion layer provided at the upper part of the semiconductor pillar A, and two lower diffusion layers which are provided inside the first active region positioned below adjacent trenches A;
the second region is provided with a cell transistor comprising:
a second active region which extends in a third direction intersecting the first direction and comprises a semiconductor;
a trench B which extends in the first direction inside the second active region;
a second gate insulating film and a gate electrode B which are provided in succession on the inner surface of the trench B; and
a pair of cell diffusion layers provided at the upper part inside the second active region on either side of the trench B, and
the gate electrode A positioned between adjacent vertical transistors is shared by adjacent vertical transistors.

Another mode of embodiment relates to a method for producing a semiconductor device, characterized in that it comprises the following steps:

a step in which a first active region which is positioned in a first region and comprises a semiconductor, and a second active region which is positioned in a second region and comprises a semiconductor extending in a third direction, are simultaneously formed;

a step in which impurity is ion-implanted in the whole surface of the first and second regions in order to simultaneously form an upper diffusion layer on the surface of the first active region and a cell diffusion layer on the surface of the second active region;

a step in which the following are simultaneously formed: three or more trenches A which extend in a first direction intersecting the third direction inside the first active region, a semiconductor pillar A comprising the first active region between adjacent trenches A, a trench B which extends in the first direction inside the second active region, a pair of semiconductor pillars B comprising the second active region on either side of the trench B, and a pair of cell diffusion layers at the upper part of the pair of semiconductor pillars B;

a step in which impurity is ion-implanted in the bottom part of the trench A in order to form a lower diffusion layer;

a step in which a first gate insulating film is formed on the inner surface of the trench A and a second gate insulating film is simultaneously formed on the inner surface of the trench B; and a step in which a gate electrode A embedded in the trench A and a gate electrode B embedded in the trench B are simultaneously formed.

Advantage of the Invention

By employing embedded gate electrodes which are embedded in trenches having a pre-limited space, there is no need to use an etch back method over the whole surface in order to form the gate electrodes. This makes it possible to form gate electrodes having a uniform height by avoiding the non-uniformity of processing caused by etch back. Vertical transistors having a double gate construction can be realized in the first region, so it is possible to improve the transistor characteristics. Furthermore, the transistor in the first region and the transistor in the second region both have a construction employing an embedded gate electrode, so it is possible to reduce the number of steps in the production of the semiconductor device by forming the first trench and second trench simultaneously. It is possible to reduce the production costs as a result.

MODE OF EMBODIMENT OF THE INVENTION

Figure 1:
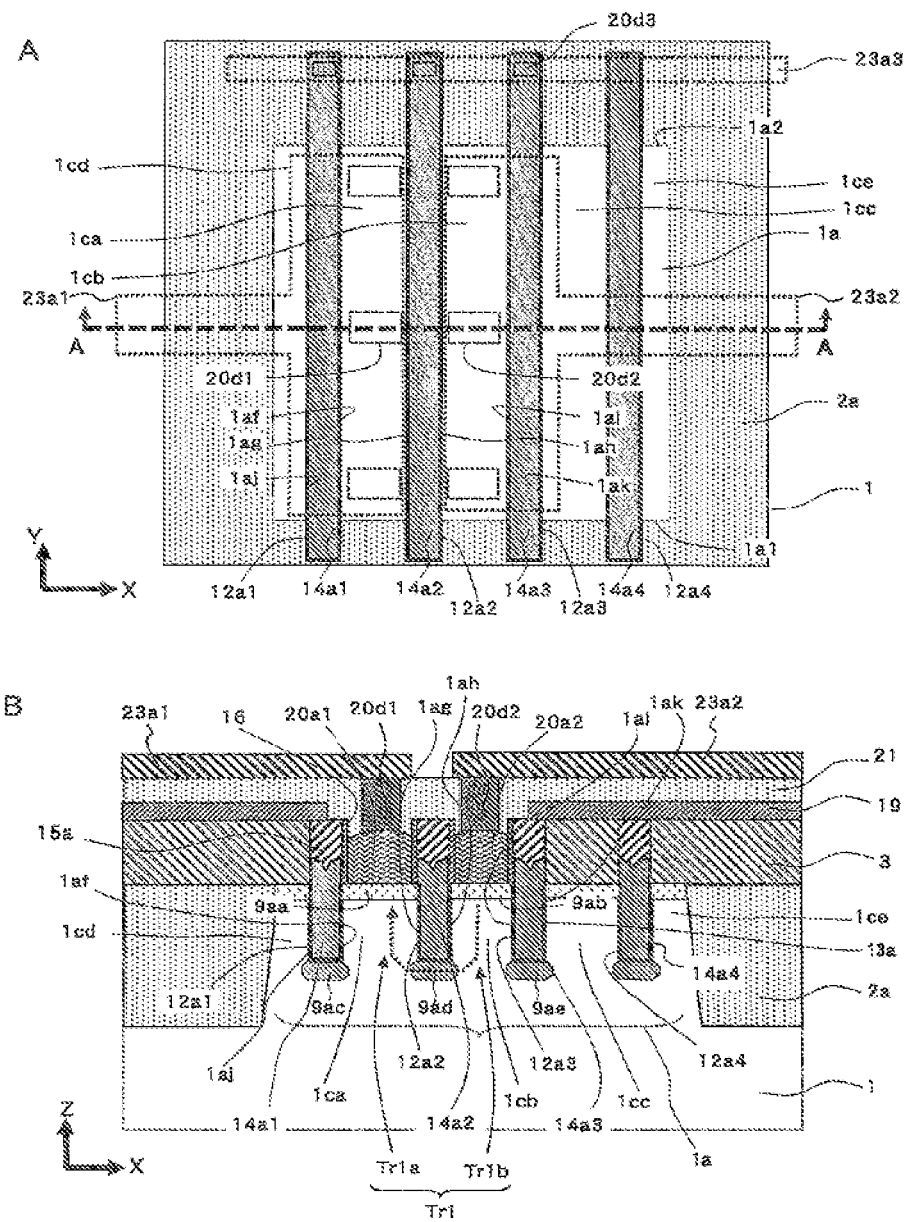
FIG. 1 is a diagram showing a peripheral circuit region constituting a first region of a semiconductor device according to a first exemplary embodiment.

This mode of embodiment relates to a semiconductor device having a peripheral circuit region (first region) including a logic circuit, and a memory cell region (second region), and to a method for producing same. With the semiconductor device and the method for producing same according to this mode of embodiment, a peripheral trench (trench A) inside the peripheral circuit region and a cell trench (trench B) inside the memory cell region are simultaneously formed in such a way as to extend in parallel with each other in a first direction. This means that there is no need to form the peripheral circuit region and the memory cell region separately, as would be the case with a conventional production method, and the number of steps in the production of the semiconductor device can be reduced. The production costs can be reduced as a result. It should be noted that the peripheral trench and the cell trench are formed simultaneously, so the peripheral trench and the cell trench typically have the same depth.

The peripheral trench is provided in such a way that a peripheral active region (first active region) extends from one end to the other end in a first direction, and is provided in such a way as to transect the peripheral active region in the first direction when seen in plan view. Three or more peripheral trenches are provided, and the peripheral active regions positioned between adjacent peripheral trenches form peripheral semiconductor pillars (semiconductor pillars A). The peripheral semiconductor pillars form a vertical transistor. The peripheral semiconductor pillars are formed by a region running from one end to the other end of the peripheral active region in the first direction, and the length thereof in the first direction is equal to the length of the peripheral active region in the first direction. Typically, the shape of the peripheral semiconductor pillars when seen in plan view is such that the length in a second direction perpendicular to the first direction is less than the length in the first direction. In contrast to this, the semiconductor pillars forming a conventional vertical transistor are formed inside an active region when seen in plan view (in such a way as not to include the end of the active region) and the shape thereof when seen in plan view is a square shape or a rectangular shape which is close to a square shape. That is to say, conventional semiconductor pillars are not formed from a region running from one end to the other end of an active region in a specific direction. The semiconductor pillars according to this mode of embodiment therefore differ from conventional semiconductor pillars in this regard. The width of the peripheral trenches is preferably between one and three times the width of a cell trench. Furthermore, the width of the peripheral semiconductor pillars in the second direction is preferably no greater than half the depth of the peripheral trenches. It is possible to produce a semiconductor device which can sufficiently handle miniaturization by setting the widths of the peripheral trenches and the peripheral semiconductor pillars within these ranges.

Furthermore, a gate electrode A is formed by embedding a conductor inside a peripheral trench, so when the upper surface of the conductor is made to recede downward by means of etch back, only the conductor which is formed in the limited space inside the peripheral trench is etched back. Whole-surface etch back as described in the patent document is therefore not used, so it is possible to easily control the uniformity of the etching back. As a result, it is possible to reduce variations in the upper surface height of the gate electrode after etch back and it is possible to improve the vertical transistor characteristics.

A peripheral transistor (vertical transistor) comprises: a peripheral active region comprising a semiconductor; two adjacent peripheral trenches; a semiconductor pillar positioned between the two peripheral trenches; a peripheral gate insulating film (first gate insulating film) and a peripheral gate electrode (gate electrode A) provided in succession on the inner surface of the peripheral trenches; an upper diffusion layer provided at the upper part of the semiconductor pillar; and a lower diffusion layer provided at the lower part of the semiconductor pillar. That is to say, the peripheral transistor has a double gate structure comprising a peripheral gate insulating film and a peripheral gate electrode which are provided on both the facing side surfaces of the semiconductor pillar (the facing inner wall side surfaces of adjacent trenches A). When the peripheral transistor is ON, a channel is formed over the whole perpendicular direction of the semiconductor pillar.

It should be noted that according to the present invention, there is no particular limitation as to the number of peripheral trenches provided that there are three or more. For example, when there are N peripheral trenches (N being an even number) it is possible to form (N−1) semiconductor pillars in adjacent second trenches. Furthermore, within the (N−1) semiconductor pillars, (N−2) semiconductor pillars form a vertical transistor.

Meanwhile, the cell transistor comprises a cell active region (second active region) which extends in a third direction inclined to a second direction and comprises a semiconductor; a cell trench (trench B) which is provided in a cell active region in such a way as to extend in a first direction intersecting the third direction; a cell gate insulating film (second gate insulating film) and a cell gate electrode (gate electrode B) which are provided in succession on the inner surface of the cell trench; and a pair of cell diffusion layers which are provided at the upper part of each cell active region either side of the cell trench. The cell gate electrode formed inside the cell trench forms an embedded gate electrode. When the cell transistor is ON, a channel is formed from one of the pair of cell diffusion layers to the other cell diffusion layer either side of the cell trench along the inner surface of the cell trench.

According to this mode of embodiment, preferably, the peripheral and cell gate insulating films should be simultaneously formed using the same material, and the peripheral gate electrode and cell gate electrode should preferably be simultaneously formed using the same material. As a result, it is possible to shorten the number of steps and to further reduce the cost of producing the semiconductor device.

The cell gate electrode may have the same upper surface height as the peripheral gate electrode without any further processing being carried out, or the upper surface thereof may be reduced to a lower level than the upper surface of the peripheral gate electrode by additional etch back.

According to this mode of embodiment, the peripheral circuit region further comprises: a peripheral element isolation region provided in such a way as to surround the peripheral active region; contact plugs which are electrically connected to each of the peripheral gate electrodes extending into the peripheral element isolation region in the first direction; and one gate power supply wiring layer which is connected to the contact plugs jointly. According to this mode of embodiment, the contact plugs are provided on the peripheral gate electrodes extending onto the element isolation region, unlike in the case of the semiconductor device in Patent Document 1 in which the contact plugs are provided on the gate electrodes provided around a dummy pillar. The contact portion with the gate electrodes can thus be endowed with a simple structure and the yield can be improved as a result.

Preferred exemplary embodiments of the present invention will be described in detail below with reference to the appended figures. It should be noted that these exemplary embodiments are specific examples which are given to provide an even deeper understanding of the present invention, but the present invention is not limited to the specific examples in any way. Furthermore, members which are the same bear the same reference symbols and they will not be described again or will only be described in simple terms. Furthermore, suitable reference symbols are omitted from members which are the same. It should be noted that the figures used in the following description are schematic and the ratios etc. of the length, width and thickness are not limited to being the same as the actual ratios. Furthermore, the materials and dimensions etc. given by way of example in the following description are just one example and the present invention is not necessarily limited thereby, and suitable modifications may be made within the scope that does not depart from the essential point of the present invention.

It should be noted that in the following exemplary embodiments, the following structures formed in the "peripheral circuit region" and the "memory cell region" correspond to the following terms given in the claims.

(1) Peripheral Circuit Region

The "peripheral circuit region" in the following exemplary embodiments corresponds to the "first region" given in the claims.

The active region formed in the peripheral circuit region in the following exemplary embodiments corresponds to the "first active region" given in the claims.

The trench formed in the peripheral circuit region in the following exemplary embodiments corresponds to the "trench A" given in the claims.

The peripheral first trench, peripheral second trench and peripheral third trench formed in the peripheral circuit region in the following exemplary embodiments correspond to the "first trench", "second trench" and "third trench", respectively, given in the claims.

The semiconductor pillar formed in the peripheral circuit region in the following exemplary embodiments corresponds to the "semiconductor pillar A" given in the claims.

The peripheral first silicon pillar and the peripheral second silicon pillar formed in the peripheral circuit region in the following exemplary embodiments correspond to the "first semiconductor pillar" and "second semiconductor pillar", respectively, given in the claims.

The gate electrode formed in the peripheral circuit region in the following exemplary embodiments corresponds to the "gate electrode A" given in the claims.

The peripheral first gate electrode, peripheral second gate electrode and peripheral third gate electrode formed in the peripheral circuit region in the following exemplary embodiments correspond to the "first gate electrode", "second gate electrode" and "third gate electrode", respectively, given in the claims.

(2) Memory Cell Region

The "memory cell region" in the following exemplary embodiments corresponds to the "second region" given in the claims.

The active region formed in the memory cell region in the following exemplary embodiments corresponds to the "second active region" given the claims.

The trench formed in the memory cell region in the following exemplary embodiments corresponds to the "trench B" given in the claims.

The semiconductor pillar formed in the memory cell region in the following exemplary embodiments corresponds to the "semiconductor pillar B" given in the claims.

The gate electrode formed in the memory cell region in the following exemplary embodiments corresponds to the "gate electrode B" given in the claims.

(3) Directions

The Y-direction in the following exemplary embodiments corresponds to the "first direction" given the claims.

The X-direction in the following exemplary embodiments corresponds to the "second direction" given the claims.

The $X_1$-direction in the following exemplary embodiments corresponds to the "third direction" given the claims.

First Exemplary Embodiment

A semiconductor device according to this exemplary embodiment will be described first of all, after which a method for producing the semiconductor device will be described.

(1) Semiconductor Device

Figure 2:
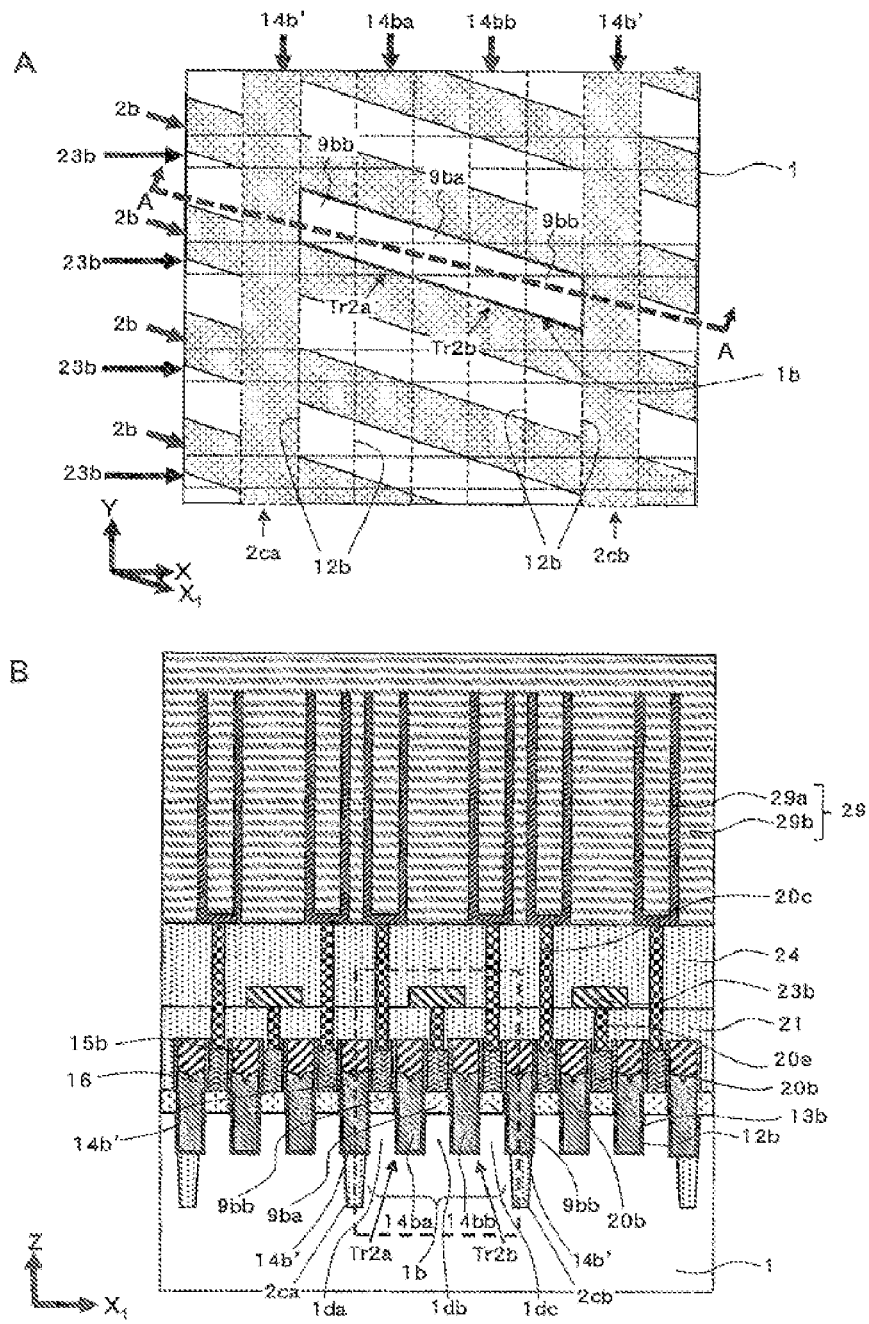
FIG. 2 is a diagram showing a memory cell region constituting a second region of the semiconductor device according to the first exemplary embodiment.
Figure 3:
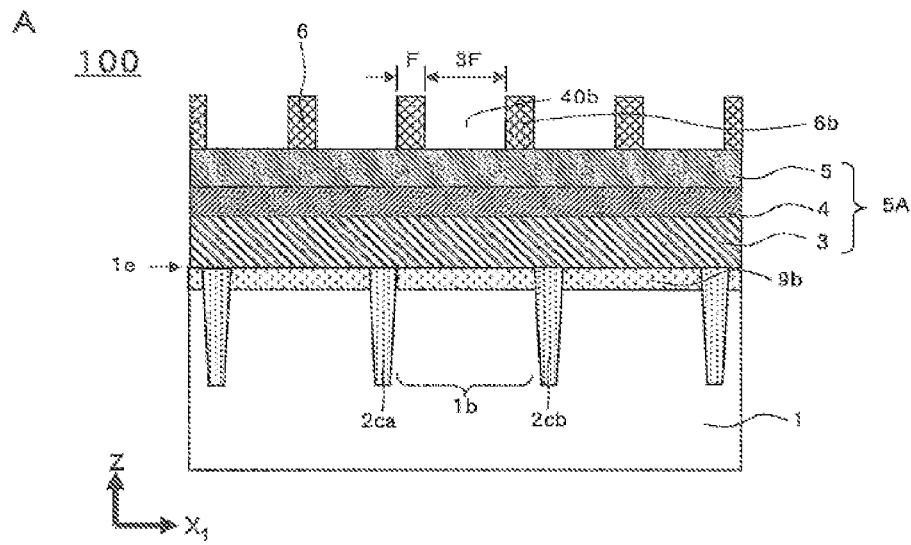
FIG. 3 is a diagram showing a method for producing the semiconductor device according to the first exemplary embodiment.
Figure 3:
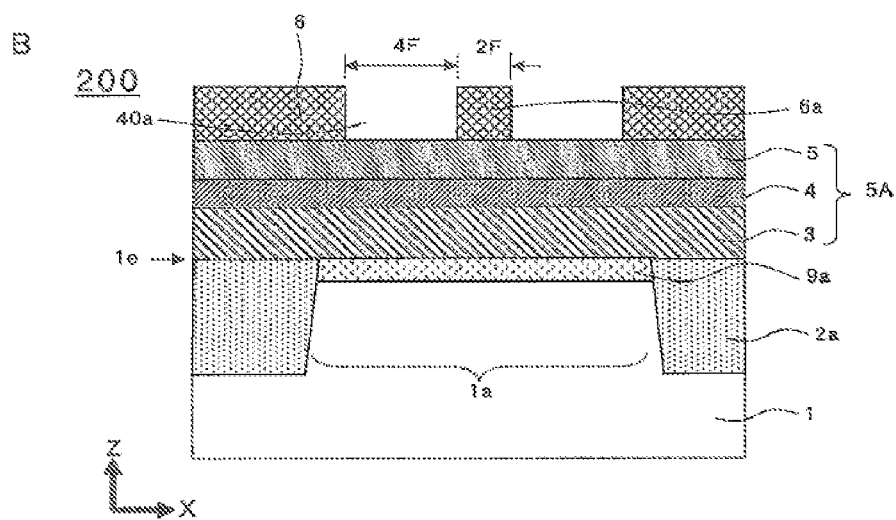
Figure 4:
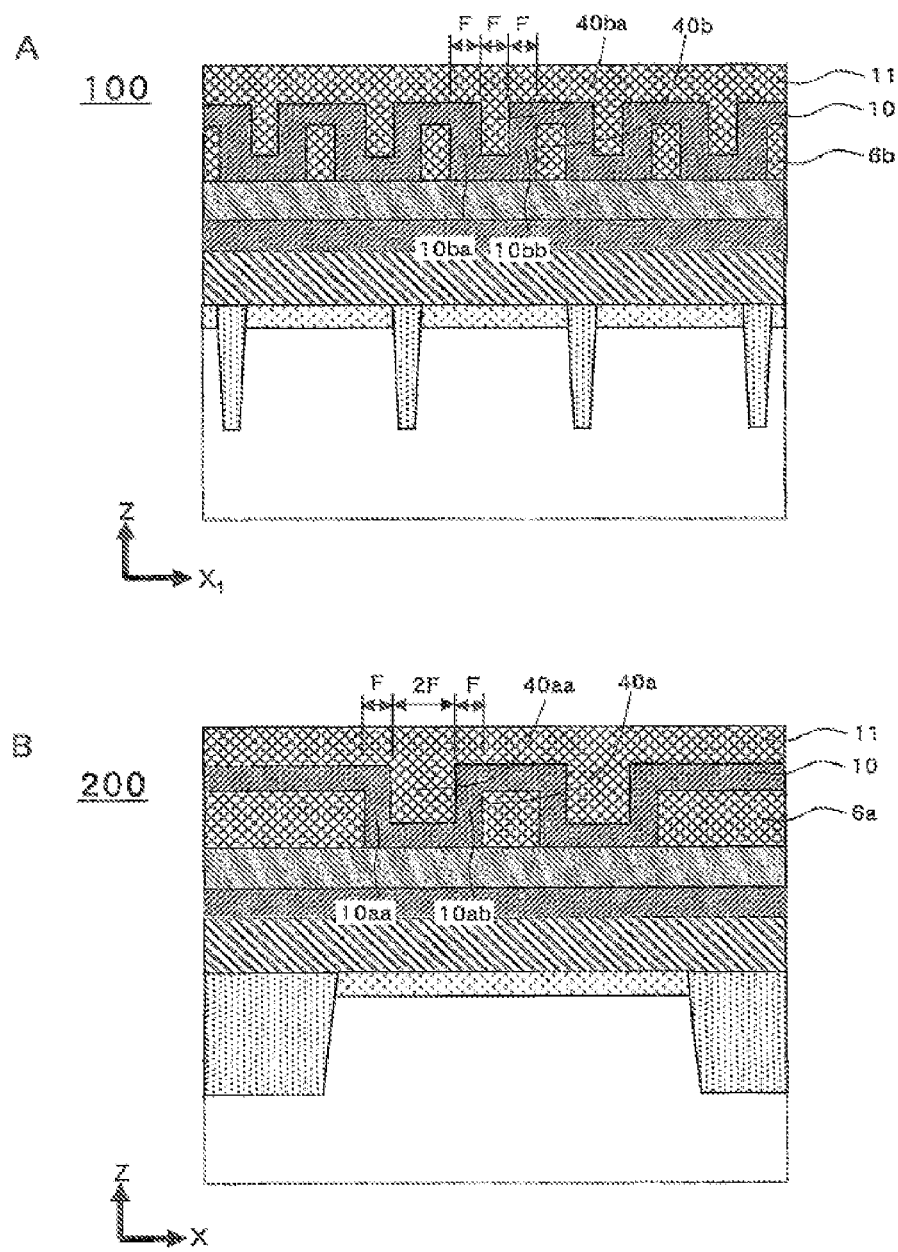
FIG. 4 is a diagram showing the method for producing the semiconductor device according to the first exemplary embodiment.
Figure 5:
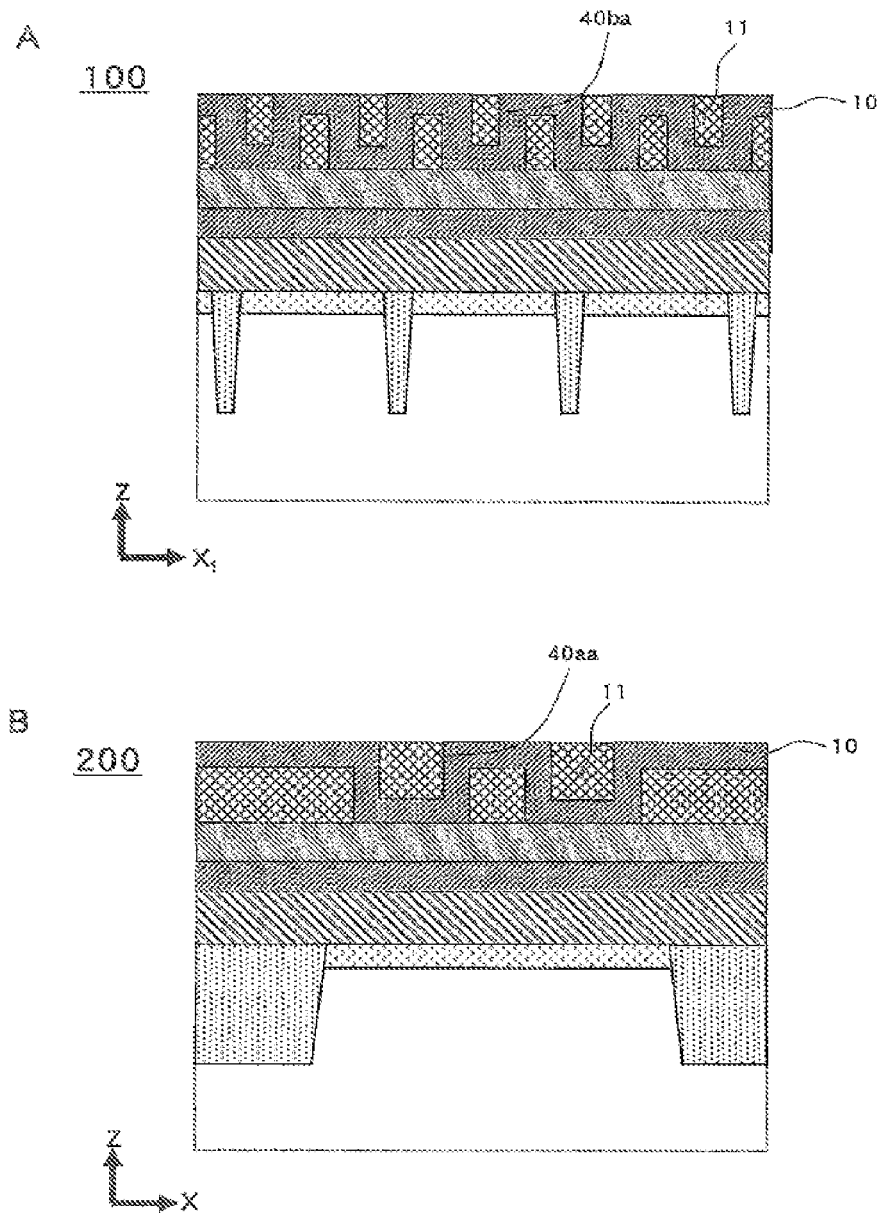
FIG. 5 is a diagram showing the method for producing the semiconductor device according to the first exemplary embodiment.
Figure 6:
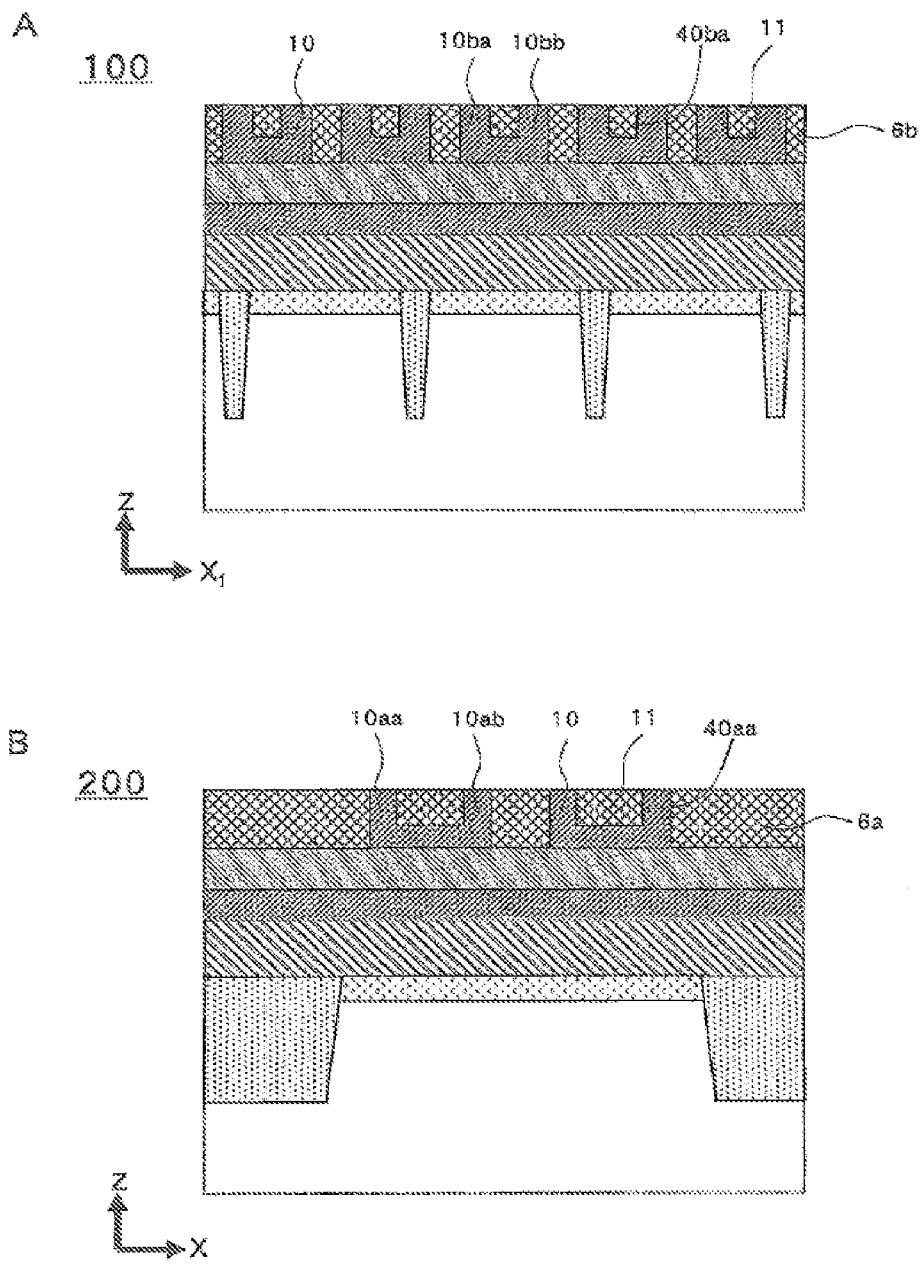
FIG. 6 is a diagram showing the method for producing the semiconductor device according to the first exemplary embodiment.
Figure 7:
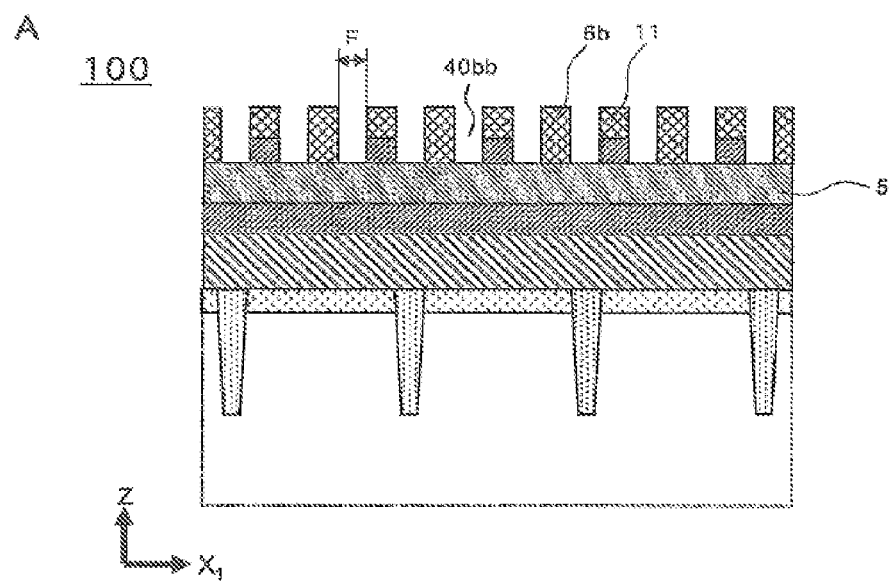
FIG. 7 is a diagram showing the method for producing the semiconductor device according to the first exemplary embodiment.
Figure 7:
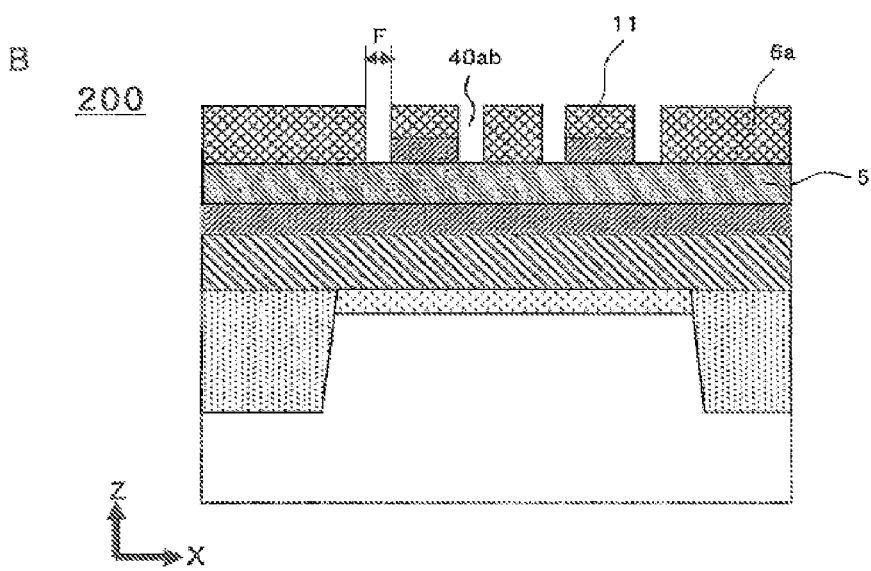

This exemplary embodiment relates to a DRAM (Dynamic Random Access Memory). The DRAM in this exemplary embodiment comprises the peripheral circuit region (first region) shown in FIG. 1 and the memory cell region (second region) shown in FIG. 2, the memory cell region having a 6F2 arrangement (where F is the minimum processing dimension). FIG. 1A is a plan view of the peripheral circuit region and FIG. 1B is a view in cross section in the direction A-A in FIG. 1A. FIG. 2A is a plan view of the memory cell region and the dotted portion in FIG. 2B is a cross section in the direction A-A' in FIG. 2A. It should be noted that FIG. 1A and FIG. 2A show only the main structure, with part of the structure being omitted.

The peripheral circuit region constituting the first region will be described first of all with reference to FIG. 1A and FIG. 1B. The peripheral circuit region constituting the first region comprises a peripheral active region (first active region) 1a surrounded by a peripheral element isolation region 2a. The peripheral active region 1a has a rectangular shape comprising two sides 1a1 and 1a2 which are facing in the Y-direction (first direction), and two sides which are facing in the X-direction (second direction) perpendicular to the Y-direction. Four peripheral trenches (trenches A) 12a are disposed in the peripheral circuit region 1a in such a way as to linearly cross over as far as the peripheral element isolation region 2a while straddling the two sides 1a1, 1a2 which are facing in the Y-direction. A peripheral first trench 12a1 comprises a first side surface 1aj and a second side surface 1af which extend in parallel in the Y-direction. A peripheral second trench 12a2 disposed adjacent to the peripheral first trench 12a1 comprises a third side surface 1ag and a fourth side surface 1ah which extend in parallel in the Y-direction. In addition, a peripheral third trench 12a3 which is disposed adjacent the to the peripheral second trench 12a2 comprises a fifth side surface 1ai and a sixth side surface 1ak which extend in parallel in the Y-direction.

By providing the four peripheral trenches 12a, a peripheral first silicon pillar (semiconductor pillar A; first semiconductor pillar) 1ca comprising a semiconductor substrate 1 and extending in the Y-direction is disposed between the peripheral first trench 12a1 and the peripheral second trench 12a2. Furthermore, a peripheral second silicon pillar (semiconductor pillar A; second semiconductor pillar) 1cb comprising the semiconductor substrate 1 and extending in the Y-direction is disposed between the peripheral second trench 12a2 and the peripheral third trench 12a3. In addition, a peripheral third silicon pillar 1cc comprising the semiconductor substrate 1 and extending in the Y-direction is disposed between the peripheral third trench 12a3 and the peripheral fourth trench 12a4. Furthermore, a peripheral fourth silicon pillar 1cd and a peripheral fifth silicon pillar 1ce are disposed between the peripheral trenches and the peripheral element isolation region 2a. As will be described later, the peripheral first silicon pillar 1ca and the peripheral second silicon pillar 1cb function as a peripheral transistor forming a vertical transistor, but the peripheral third silicon pillar 1cc, the peripheral fourth silicon pillar 1cd and the peripheral fifth silicon pillar 1ce do not function as a peripheral transistor.

The two side surfaces forming part of the peripheral first silicon pillar 1ca coincide with the second side surface 1af and the third side surface 1ag. Furthermore, the two side surfaces forming part of the peripheral second silicon pillar 1cb coincide with the fourth side surface 1ah and the fifth side surface 1ai. First to fourth peripheral gate electrodes (gate electrodes A) 14a1, 14a2, 14a3, 14a4 are disposed at equal pitch intervals in the X-direction (second direction) perpendicular to the Y-direction, embedded in the peripheral trenches 12a. The peripheral fourth gate electrode 14a4 does not function as a transistor gate electrode.

As shown in FIG. 1A, the planar shape of the peripheral first silicon pillar 1ca and the peripheral second silicon pillar 1cb is a rectangle in which the length in the Y-direction is greater than the width in the X-direction. For example, the length in the Y-direction is in the range of 2-20 times the width in the X-direction. Three each of wiring contact plugs 20d1, 20d2 are disposed on the upper surfaces of the peripheral first silicon pillar 1ca and the peripheral second silicon pillar 1cb which function as a peripheral transistor, for example. Peripheral first wiring 23a1 which is connected to the peripheral first silicon pillar 1ca by way of the three wiring contact plugs 20d1, and peripheral second wiring 23a2 which is connected to the peripheral second silicon pillar 1cb by way of the three wiring contact plugs 20d2 are provided.

A gate electrode in a conventional vertical transistor surrounds the whole periphery of a silicon pillar and is formed by whole-surface etch back, but the peripheral gate electrodes 14a1, 14a2, 14a3 in this exemplary embodiment extend in a straight line in the Y-direction along the side surfaces of the corresponding silicon pillar. The whole periphery of the silicon pillar is therefore not surrounded. Furthermore, said gate electrodes function as gate electrodes embedded in the peripheral trenches 12a which are provided in advance.

To be more specific, the peripheral first gate electrode 14a1 and the peripheral second gate electrode 14a2 extend in parallel as two straight lines in the Y-direction along the two side surfaces 1af, 1ag forming part of the peripheral first silicon pillar 1ca and facing in the X-direction, and reach as far as gate contact sections 20d3 on the peripheral element isolation region 2a. Furthermore, the peripheral second gate electrode 14a2 and the peripheral third gate electrode 14a3 extend in parallel as two straight lines in the Y-direction along the two side surfaces 1ah, 1ai forming part of the peripheral second silicon pillar 1cb and facing in the X-direction, and reach as far as the gate contact sections 20d3 on the peripheral element isolation region 2a. All of the peripheral gate electrodes are connected to a single gate power supply wiring 23a3.

As shown in FIG. 1B, the four peripheral trenches (trenches A) 12a1, 12a2, 12a3, 12a4 are uniformly disposed in the X-direction in the peripheral active region 1a. A peripheral gate insulating film (first gate insulating film) 13a is disposed on the inner surface of each of the peripheral trenches 12a. The peripheral gate electrodes 14a1, 14a2, 14a3, 14a4 are disposed in such a way as to cover the peripheral gate insulating film 13a and to be embedded in the peripheral trenches 12a.

A peripheral transistor Tr1 having a construction in which two vertical transistors are connected in series is shown in the peripheral active region 1a. The peripheral transistor Tr1 is formed by a first vertical transistor Tr1a having the peripheral first silicon pillar 1ca as a channel, and a second vertical transistor Tr1b having the peripheral second silicon pillar 1cb as a channel.

The first vertical transistor Tr1a is formed by the peripheral first gate electrode 14a1 which is embedded, with the interposition of the peripheral gate insulating film 13a, in the peripheral first trench 12a1 in contact with one of the side surfaces 1af of the peripheral first silicon pillar 1ca; the peripheral second gate electrode 14a2 which is embedded, with the interposition of the peripheral gate insulating film 13a, in the peripheral second trench 12a2 in contact with the other side surface 1ag; a peripheral first upper diffusion layer 9aa which is disposed at the upper part of the peripheral first silicon pillar 1ca; and a first lower diffusion layer 9ac in contact with the bottom surface of the peripheral first trench 12a1 and a second lower diffusion layer 9ad in contact with the bottom surface of the peripheral second trench 12a2.

The second vertical transistor Tr1b is formed by the peripheral second gate electrode 14a2 which is embedded, with the interposition of the peripheral gate insulating film 13a, in the peripheral second trench 12a2 in contact with one of the side surfaces 1ah of the peripheral second silicon pillar 1cb; the peripheral third gate electrode 14a3 which is embedded, with the interposition of the peripheral gate insulating film 13a, in the peripheral third trench 12a3 in contact with the other side surface 1ai; a peripheral second upper diffusion layer 9ab which is disposed at the upper part of the peripheral second silicon pillar 1cb; and a second lower diffusion layer 9ad in contact with the bottom surface of the peripheral second trench 12a2 and a third lower diffusion layer 9ae in contact with the bottom surface of the peripheral third trench 12a3.

Furthermore, the second lower diffusion layer 9ad is shared by the first vertical transistor Tr1a and the second vertical transistor Tr1b.

The first vertical transistor Tr1a and the second vertical transistor Tr1b both have a double gate structure including a gate electrode on two side surfaces of a silicon pillar which are facing in the X-direction. The peripheral second gate electrode 14a2 is positioned between the two vertical transistors which are adjacent in the X-direction and is shared. The peripheral first gate electrode 14a1, peripheral second gate electrode 14a2 and peripheral third gate electrode 14a3 extend in the Y-direction up to the peripheral element isolation region 2a, and are connected to the gate power supply wiring 23a3 (not shown in FIG. 1B) by way of the gate contact plugs 20d3 (not shown in FIG. 1B). In FIG. 1A, the peripheral gate electrodes are connected to the same gate power supply wiring 23a3, so all of the peripheral gate electrodes have the same potential. However, this is not limiting, and the peripheral first gate electrode 14a1 and peripheral third gate electrode 14a3, and the peripheral second gate electrode 14a2 may equally be connected to separate gate power supply wiring. In this case, it is possible to apply individual voltages from both side surfaces to one silicon pillar, so the threshold voltage of each vertical transistor can be controlled with greater precision.

The peripheral first wiring 23a1 which constitutes source (drain) wiring is connected to the first upper diffusion layer 9aa of the first vertical transistor Tr1a by way of a peripheral upper contact plug (first contact plug) 20a1 and the wiring contact plugs 20d1 that pass through a first interlayer insulating film 21. Meanwhile, the peripheral second wiring 23a2 which constitutes drain (source) wiring is connected to the second upper diffusion layer 9ab of the second vertical transistor Tr1b by way of a peripheral upper contact plug (first contact plug) 20a2 and the wiring contact plugs 20d2. For example, when a relatively higher voltage is applied to the peripheral second wiring 23a2 than to the peripheral first wiring 23a1, current flows from the second vertical transistor Tr1b toward the first vertical transistor Tr1a via the second lower diffusion layer 9ad, as shown by the dotted-line arrow in FIG. 1B. When a reverse bias is applied, current flows in the opposite direction. The peripheral transistor Tr1 according to this mode of embodiment functions as a single series transistor in which the two vertical transistors Tr1*a* and Tr1*b* having a double gate structure are connected in series.

When a current attempts to flow downward in one of the vertical transistors in this arrangement, current necessarily flows upward in the other vertical transistor. The characteristic variation specific to vertical transistors which is caused by variations in the vertical shape of silicon pillars can therefore be cancelled out. Furthermore, the vertical transistors each have a double gate structure, so it is possible to improve the transistor characteristics such as threshold voltage, S coefficient (sub-threshold characteristics) and drive current.

A peripheral cap insulating film 15*a* comprising a silicon nitride film is provided on each of the peripheral gate electrodes 14*a*. A side wall insulating film 16 comprising a silicon nitride film is provided on both side surfaces of the peripheral gate electrodes 14*a* and the peripheral cap insulating film 15*a*. A silicon dioxide film 3 forming part of a hard mask film and a silicon nitride film 19 forming a cover film are provided on a partial region of the silicon substrate 1. Furthermore, the first interlayer insulating film 21 comprising a silicon dioxide film is provided in such a way as to cover the silicon substrate 1. A second interlayer insulating film which is not depicted is disposed in such a way as to cover the peripheral first wiring 23*a*1 and peripheral second wiring 23*a*2 which are provided on the first interlayer insulating film 21. In addition, other interlayer insulating films, a via plug and upper layer wiring etc. which are not depicted are provided as upper layers.

The semiconductor device according to this exemplary embodiment comprises: the peripheral active region 1*a* disposed inside the semiconductor substrate 1; the first trench 12*a*1 disposed inside the peripheral active region 1*a* and has the first side surface 1*aj* and the second side surface 1*af* extending in parallel in the first direction; the second trench 12*a*2 which has the third side surface 1*ag* and the fourth side surface 1*ah* extending in parallel in the first direction; and the third trench 12*a*3 which has the fifth side surface 1*ai* and the sixth side surface 1*ak* extending in parallel in the first direction. The semiconductor device comprises: the first gate electrode 14*a*1 which is embedded in the first trench 12*a*1; the second gate electrode 14*a*2 which is embedded in the second trench 12*a*2; and the third gate electrode 14*a*3 which is embedded in the third trench 12*a*3. The semiconductor device comprises the first silicon pillar 1*ca* which is positioned between the first trench 12*a*1 and the second trench 12*a*2 and shares the second side surface 1*af* and the third side surface 1*ag*. Furthermore, the semiconductor device comprises the second silicon pillar 1*cb* which is positioned between the second trench 12*a*2 and the third trench 12*a*3 and shares the fourth side surface 1*ah* and the fifth side surface 1*ai*. The first silicon pillar 1*ca* forms the first vertical transistor Tr1*a* in which the first gate electrode 14*a*1 and the second gate electrode 14*a*2 form a double gate electrode. The second silicon pillar 1*cb* forms the second vertical transistor Tr1*b* in which the second gate electrode 14*a*2 and the third gate electrode 14*a*3 form a double gate electrode. The second gate electrode 14*a*2 is shared by the first vertical transistor Tr1*a* and the second vertical transistor Tr1*b*.

The memory cell region constituting the second region will be described next with the aid of FIG. 2A and FIG. 2B.

As shown in FIG. 2A, a plurality of cell active regions (second active regions) 1*b* which are enclosed by cell first element isolation regions 2*b* extending in the $X_1$-direction (third direction) inclined to the X-direction and cell second element isolation regions 2*ca*, 2*cb* extending in the Y-direction (first direction) are disposed at predetermined intervals in the memory cell region of the DRAM (semiconductor device) according to this exemplary embodiment. The cell active regions 1*b* extend in the $X_1$-direction. Two cell gate electrodes (gate electrodes B) 14*ba*, 14*bb* constituting word lines are disposed across the plurality of cell active regions 1*b*, embedded in cell trenches (trenches B) 12*b* extending in the Y-direction. Furthermore, embedded wiring 14*b*' for element isolation is disposed at positions lying over the cell second element isolation regions 2*ca*, 2*cb*, embedded in the cell trenches 12*b* extending in the Y-direction. The cell trenches 12*b* are provided at predetermined intervals in the X-direction. In addition, a plurality of bit lines 23*b* extending in the X-direction (second direction) orthogonal to the cell gate electrodes 14*ba*, 14*bb* at the embedded wiring 14*b*' are disposed at predetermined intervals in the Y-direction. Two cell trenches divide one cell active region 1*b* into three regions comprising two cell second diffusion layers (capacitance diffusion layer regions) 9*bb* positioned at both ends and a cell first diffusion layer (bit line diffusion layer region) 9*ba* positioned in the center. Cell transistors Tr2*a*, Tr2*b* are then disposed in regions intersected by the cell gate electrodes 14*ba*, 14*bb* and the cell active region 1*b*. That is to say, the first transistor Tr2*a* is formed by: one cell second diffusion layer 9*bb*, the cell first gate electrode 14*ba*, and the cell first diffusion layer 9*ba*. Furthermore, the second transistor Tr2*b* is formed by the cell first diffusion layer 9*ba*, the cell second gate electrode 14*bb*, and the other cell second diffusion layer 9*bb*.

The cell gate electrodes (word lines) 14*ba*, 14*bb* and the embedded wiring 14*b*' have the same structure but different functions. The cell gate electrodes 14*ba*, 14*bb* are used as gate electrodes of the respective cell transistors Tr2*a*, Tr2*b*. On the other hand, the embedded wiring 14*b*' is a simple dummy gate electrode in which a gate electrode is embedded in a trench necessarily formed as the cell trenches 12*b* are formed. However, if the embedded wiring 14*b*' is set in a floating state, the adjacent cell transistors with the embedded wiring 14*b*' lying therebetween are subject to electrical interference and the operation thereof becomes unstable. In order to avoid this, the embedded wiring 14*b*' is held at a separate predetermined potential from the cell gate electrodes 14*ba*, 14*bb*. The embedded wiring 14*b*' functions as a gate electrode for element isolation.

Furthermore, as shown in FIG. 2A and FIG. 2B, a plurality of memory cell regions are formed in the memory cell region as a whole. The individual memory cell regions comprise a capacitor 29 which is connected to the cell second diffusion layers 9*bb* of the cell transistors Tr2*a*, Tr2*b*, and a bit line 23*b* which is connected to the cell first diffusion layer 9*ba* shared by two transistors.

The cell first transistor Tr2*a* comprises: the cell first gate electrode 14*ba*, a cell gate insulating film (second gate insulating film) 13*b* comprising a silicon dioxide film or the like, and a pair comprising the cell first diffusion layer 9*ba* and cell second diffusion layers 9*bb* which are formed on the surface of the semiconductor substrate 1 on either side of the cell first gate electrode 14*ba*. The cell first diffusion layer 9*ba* and the cell second diffusion layers 9*bb* form a source or drain, respectively. The cell first gate electrode 14*ba* is provided on the cell gate insulating film 13*b* which covers the inner surfaces of the cell trenches 12*b*. A cell cap insulating film 15*b* comprising a silicon nitride film is provided on the cell gate first electrode 14*ba* and the embedded wiring 14*b*'. The side wall insulating film 16 comprising a silicon nitride film is provided on both side surfaces of the cell first gate electrode 14ba, the embedded wiring 14b', and the cell cap insulating film 15b.

The cell second transistor Tr2b also has the same structure. It should be noted that the two cell transistors Tr2a, Tr2b are shown in the portion enclosed by the dotted lines in FIG. 2B, i.e. in one cell active region 1b, and the cell first diffusion layer 9ba is shared by the two cell transistors Tr2a, Tr2b. The cell first transistor Tr2a and the cell second transistor Tr2b are each connected to separate capacitors 29 and operate as independent embedded gate-type transistors.

The cell transistors appear to have the same double gate structure as the peripheral transistors, but they do not have double gate structures. That is to say, the embedded wiring 14b' disposed on the cell second element isolation regions 2ca, 2cb is a gate electrode for element isolation and is held at a different voltage than that of the cell gate electrodes 14ba, 14bb. Accordingly, the embedded wiring 14b' does not function as a cell transistor gate electrode. For example, a gate electrode which can enable operation of the cell first transistor Tr2a is present only at the cell first gate electrode 14ba. In this case, a channel is formed only at the surface of the semiconductor substrate 1 positioned at the bottom surface and on both sides surfaces of the cell trenches 12b in which the cell first gate electrode 14ba is embedded. On the other hand, the whole of the silicon pillar 1ca functions as a channel in the peripheral transistor Tr1a formed by a double gate structure.

The first and second interlayer insulating films 21, 24 comprising a silicon dioxide film are provided on the silicon substrate 1. The cell first diffusion layer 9ba is connected to the bit line 23b by way of a bit contact plug 20e which is provided in such a way as to pass through a cell upper contact plug 20b and the first interlayer insulating film 21. The cell second diffusion layers 9bb are connected to the capacitor 29 by way of a capacitance contact plug 20c provided in such a way as to pass through the cell upper contact plug 20b and the first and second interlayer insulating films 21, 24. The capacitor 29 comprises a lower electrode 29a, a capacitance insulating film (not depicted), and an upper electrode 29b. A third interlayer insulating film, a wiring contact passing through the third interlayer insulating film and reaching the upper electrode 29b, wiring connected to the wiring contact, and a protective insulating film for covering the wiring (none of which is depicted) are formed in such a way as to cover the upper electrode 29b.

(2) Method for Producing the Semiconductor Device

A method for producing the semiconductor device according to the first exemplary embodiment will be described next with reference to FIG. 3 to FIG. 12. In the figures, each of the "A" figures is a diagram corresponding to a cross section in the direction A-A in FIG. 2A showing a plan view of the memory cell region. Furthermore, each of the "B" figures is a diagram corresponding to a cross section in the direction A-A in FIG. 1A showing a plan view of the peripheral circuit region.

A summary of the production method according to this exemplary embodiment will be given before a detailed description is given.

As indicated above, the semiconductor device according to this exemplary embodiment comprises an embedded gate-type transistor disposed in the memory cell region and a vertical transistor disposed in the peripheral circuit region, and thus comprises transistors having different structures. In general, a step in which the peripheral circuit region is produced is therefore carried out after a step in which the memory cell region is produced, for example. The method for producing a semiconductor device according to this exemplary embodiment employs a shared step of producing the embedded gate-type transistor disposed in the memory cell region and the vertical transistor disposed in the peripheral circuit region, rather than the memory cell region and the peripheral circuit region being separately produced, so according to this production method the two are formed essentially simultaneously. In particular, the semiconductor device according to this exemplary embodiment is formed by conductors in which gate electrodes of the transistor formed in the memory cell region and gate electrodes of the transistor formed in the peripheral circuit region are both embedded in trenches formed in a semiconductor substrate, so it is a simple matter for production steps to be shared.

In the method for producing a semiconductor device according to this exemplary embodiment, the following constituent elements are formed in the same steps.

(1) Peripheral active region (first active region) 1a in the peripheral circuit region, cell active region (second active region) 1b in the memory cell region;
(2) Peripheral trenches (trenches A) 12a in the peripheral circuit region, cell trenches (trench B) in the memory cell region;
Peripheral silicon pillars (semiconductor pillars A) 1c in the peripheral circuit region, cell silicon pillars (semiconductor pillars B) 1da, 1db, 1dc in the memory cell region;
(3) Upper diffusion layers 9aa, 9ab in the peripheral circuit region, cell diffusion layers (bit line diffusion layer 9ba and capacitance diffusion layer 9bb) in the memory cell region;
(4) Peripheral gate insulating film (first gate insulating film) 13a in the peripheral circuit region, cell gate insulating film (second gate insulating film) 13b in the memory cell region;
(5) Peripheral gate electrodes (gate electrodes A) 14a in the peripheral circuit region, cell gate electrodes (gate electrodes B) 14b and embedded wiring 14b' in the memory cell region;
(6) Peripheral cap insulating film 15a in the peripheral circuit region, cell cap insulating film 15b in the memory cell region; and
(7) Upper contact plug 20a in the peripheral circuit region, upper contact plug 20b in the memory cell region.

It is therefore possible to limit an increase in production costs by minimizing an increase in the number of production steps. Furthermore, the peripheral trenches 12a and the cell trenches 12b are formed to the same depths. The peripheral gate insulating film 13a and the cell gate insulating film 13b are formed from the same material. The peripheral gate electrodes 14a, cell gate electrodes 14b and embedded wiring 14b' are formed from the same material. The peripheral upper contact plug 20a and cell upper contact plug 20b are formed from the same material.

The method for producing a semiconductor device according to this exemplary embodiment will be described in detail below with reference to the figures.

First of all, as shown in FIG. 3A and FIG. 3B, an element isolation region for defining a peripheral active region (first active region) 1a and a cell active region (second active region) 1b are formed inside a memory cell region 100 and a peripheral circuit region 200 of a p-type single-crystal silicon substrate 1 using photolithography and dry etching. Specifically, the element isolation region is formed by embedding a silicon dioxide film and a silicon nitride film in an element isolation trench formed by an element isolation region pattern in the silicon substrate 1. As a result, a peripheral element isolation region 2a enclosing the rectangular peripheral active region 1a is formed in the peripheral circuit region 200 as shown in FIG. 1A. Furthermore, a cell first element isolation region 2b (not shown in FIG. 3A)

extending in the $X_1$-direction (third direction) inclined to the X-direction (second direction), and cell second element isolation regions 2ca, 2cb extending in the Y-direction (first direction) perpendicular to the X-direction are formed in the memory cell region 100 in such a way as to enclose the parallelogram-shaped cell active region 1b.

A diffusion layer is then formed on the surface of the semiconductor substrate 1 by ion implantation of n-type impurity such as arsenic over the whole surface. As a result, a peripheral diffusion layer 9a is formed in the peripheral circuit region 200. Furthermore, a cell diffusion layer 9b is formed in the memory cell region 100. The impurity concentration in the diffusion layers 9a, 9b is set at $1 \times 10^{17}$ to $1 \times 10^{19}$ (atoms/cm$^3$). The peripheral diffusion layer 9a constitutes an upper diffusion layer of a vertical transistor which will be subsequently formed, while the cell diffusion layer 9b functions as a source and drain of an embedded gate-type transistor which will be subsequently formed.

A hard mask film 5A comprising a silicon dioxide film 3, a silicon nitride film 4 and an amorphous carbon film 5, and a first organic film 6 such as an antireflection film (BARC film) having a photoresist on the uppermost surface are then formed in succession by means of CVD or the like over the whole surface of an upper surface 1e of the silicon substrate 1. The first organic film 6 is patterned using photolithography and dry etching. As a result, a mask pattern 6b is formed in the memory cell region 100 and a mask pattern 6a is formed in the peripheral circuit region 200. After this, the photoresist is removed. In this exemplary embodiment, if the minimum processing dimension constituting the resolution limit of photolithography is F, then the width in the $X_1$-direction of the first organic film 6b formed in the memory cell region 100 is F and the width of spaces (cell first openings) 40b is 3F. Furthermore, the width in the X-direction of the first organic film 6a formed in the active region 1a of the peripheral circuit region 200 is 2F, and the width of spaces (peripheral first openings) 40a is 4F. It should be noted that the cross section of the memory cell region 100 and FIG. 3A is a cross section in the $X_1$-direction inclined to the X-direction, so the actual size is slightly greater than F, but is described here as F for the sake of convenience.

Next, as shown in FIG. 4A and FIG. 4B, a sacrificial film 10 comprising a silicon dioxide film having a thickness F that does not completely fill the cell first openings 40b is formed over the whole surface by means of CVD. As a result, a cell first side-wall section 10ba and a cell second side-wall section 10bb comprising the sacrificial film 10 are formed on the side walls inside the cell first openings 40b in the memory cell region 100, and cell second openings 40ba having a width F are formed in the center in the $X_1$-direction. Furthermore, a peripheral first side-wall section 10aa and a peripheral second side-wall section 10ab comprising the sacrificial film 10 are formed on the side walls inside the peripheral first openings 40a in the peripheral circuit region 200, and peripheral second openings 40aa having a width 2F are formed in the center in the X-direction. A second organic film 11 such as an antireflection film (BARC film) is then formed by means of spin coating in order to fill the cell second openings 40ba and the peripheral second openings 40aa.

Next, as shown in FIG. 5A and FIG. 5B, the second organic film 11 is etched back by means of dry etching in order to expose the upper surface of the sacrificial film 10. As a result, the upper surface of the second organic film 11 which fills the second openings 40aa, 40ba and the upper surface of the sacrificial film 10 become flush.

Next, as shown in FIG. 6A and FIG. 6B, the sacrificial film 10 formed on the upper surface of the first organic film 6a, 6b, and the second organic film 11 which fills the second openings 40aa, 40ba are etched back by means of dry etching in order to expose the upper surfaces of the cell second side-wall section 10bb, peripheral first side-wall section 10aa, and peripheral second side-wall section 10ab. As a result, the upper surfaces of the cell side-wall sections 10ba, 10bb and of the peripheral side-wall sections 10aa, 10ab become flush with the upper surfaces of the first organic film 6a, 6b and the second organic film 11.

Next, as shown in FIG. 7A and FIG. 7B, the sacrificial film 10 whereof the upper surface is exposed is selectively removed by means of anisotropic dry etching employing the first organic film 6a, 6b and the second organic film 11 as a mask. As a result, cell third openings 40bb and peripheral third openings 40ab having a width F in the $X(X_1)$-direction are formed in either the memory cell region 100 or the peripheral circuit region 200. The upper surface of the amorphous carbon film 5 is exposed at the bottom surface of the third openings.

Figure 8:
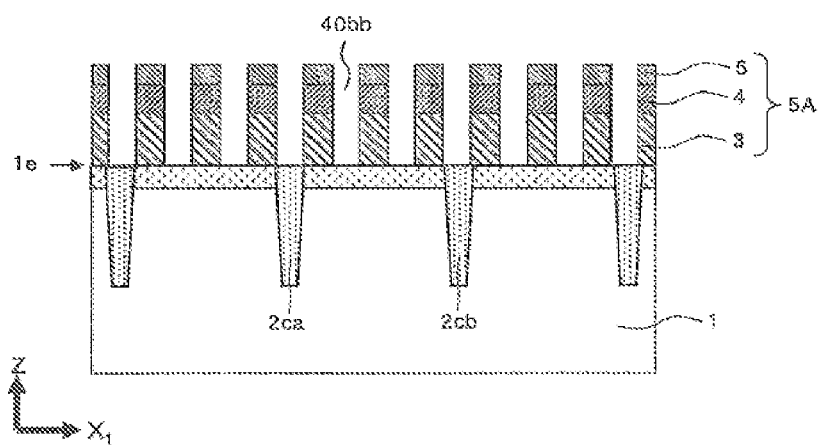
FIG. 8 is a diagram showing the method for producing the semiconductor device according to the first exemplary embodiment.
Figure 8:
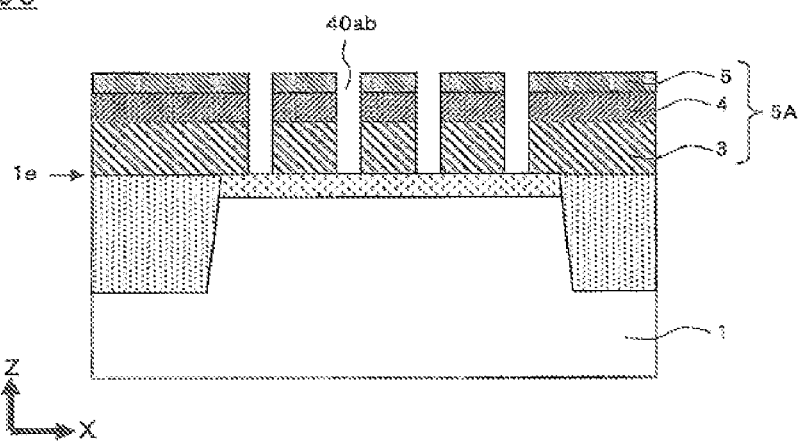

Next, as shown in FIG. 8A and FIG. 8B, the amorphous carbon film 5, silicon nitride film 4 and silicon dioxide film 3 are successively subjected to anisotropic dry etching using the first organic film 6a, 6b and the second organic film 11 (none of which is shown in FIG. 8) as a mask. As a result, the cell third openings 40bb and peripheral third openings 40ab are transferred to the hard mask film 5A in either the memory cell region 100 or the peripheral circuit region 200. The upper surface 1e of the silicon substrate 1 is exposed at the bottom surface of some of the third cell openings 40bb formed in the memory cell region 100, and the upper surfaces of the cell second element isolation regions 2ca, 2cb are exposed at the bottom surface of the other cell third openings 40bb. Furthermore, the upper surface 1e of the silicon substrate 1 is exposed at the bottom surface of the peripheral third openings 40ab formed in the peripheral circuit region 200. Furthermore, the first organic film 6, second organic film 11 and sacrificial film 10 are removed by this anisotropic dry etching.

Figure 9:
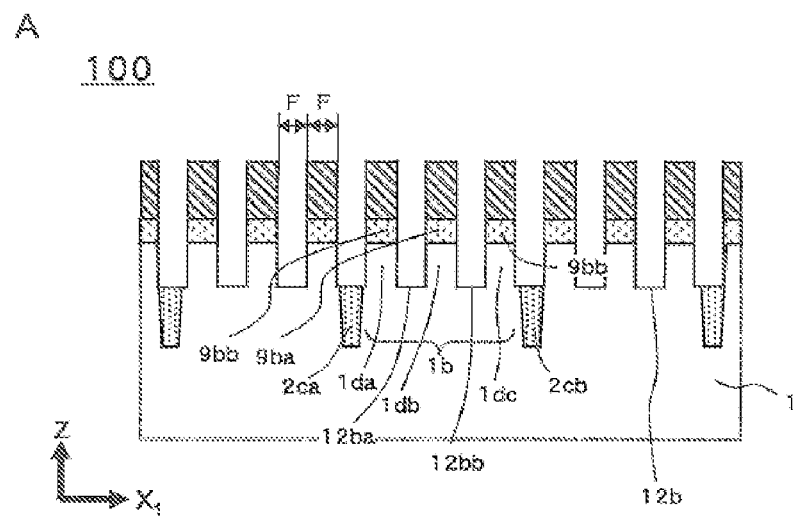
FIG. 9 is a diagram showing the method for producing the semiconductor device according to the first exemplary embodiment.
Figure 9:
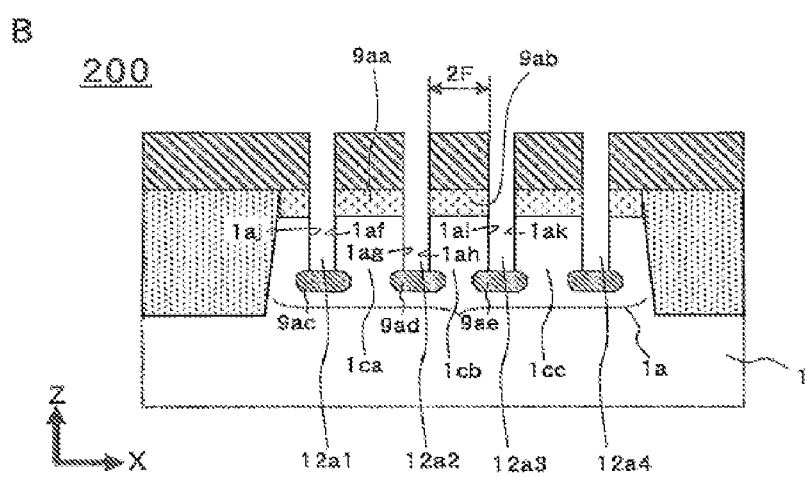

Next, as shown in FIG. 9A and FIG. 9B, the silicon substrate 1 and the cell second element isolation regions 2ca, 2cb having exposed upper surfaces are subjected to anisotropic dry etching using the hard mask film 5A (not shown in FIG. 9) as a mask, thereby forming cell trenches (trenches B) 12b and peripheral trenches (trenches A) 12a. The amorphous carbon film 5 and the silicon nitride film 4 are removed at this point.

As a result, the cell trenches 12b having a width F in the $X_1$-direction and silicon pillars having a width F in the $X_1$-direction and lying between the cell trenches 12b are formed in a repetitive manner in the $X_1$-direction. To be more specific, a cell first silicon pillar 1da, a cell first trench 12ba, a cell second silicon pillar 1db, a cell second trench 12bb, and a cell third silicon pillar 1dc are formed in succession in the $X_1$-direction adjacent to the cell second element isolation region 2ca in one cell active region 1b. Furthermore, a cell diffusion layer 9b is divided in three into: a cell first diffusion layer 9ba positioned at the upper part of the cell second silicon pillar 1db, and cell second diffusion layers 9bb positioned at the upper parts of the cell first silicon pillar 1da and the cell third silicon pillar 1dc, respectively.

Meanwhile, a peripheral first trench 12a1 having a first side surface 1aj and a second side surface 1af which are facing in the X-direction; a peripheral first silicon pillar 1ca; a peripheral second trench 12a2 having a third side surface 1*ag* and a fourth side surface 1*ah* which are facing in the X-direction; a peripheral second silicon pillar 1*cb*; a peripheral third trench 12*a*3 having a fifth side surface 1*ai* and a sixth side surface 1*ak* which are facing in the X-direction; and a peripheral fourth trench 12*a*4 are formed in succession in the X-direction in such a way as to be adjacent in the peripheral active region 1*a* of the peripheral circuit region 200. The second side surface 1*af* and the third side surface 1*ag* share the side surfaces of the first silicon pillar 1*ca*. The fourth side surface 1*ah* and the fifth side surface 1*ai* share the side surfaces of the second silicon pillar 1*cb*. Furthermore, a peripheral diffusion layer 9*a* is divided into at least two diffusion layers, namely a peripheral first upper diffusion layer 9*aa* positioned at the upper part of the peripheral first silicon pillar 1*ca*, and a peripheral second upper diffusion layer 9*ab* positioned at the upper part of the peripheral second silicon pillar 1*cb*.

The cell trenches 12*b* and the peripheral trenches 12*a* are formed in the same step, so the depth thereof is the same. Furthermore, the width of both in the $X(X_1)$-direction is governed by the thickness of the sacrificial film 10 formed in FIG. 4, so they are formed with the same width. In this exemplary embodiment, the thickness of the sacrificial film is F, so the width in the X-direction of all the trenches formed in the memory cell region 100 and the peripheral circuit region 200 is F. The sacrificial film 10 is formed using a deposition method such as CVD, so the thickness thereof can be freely selected. That is to say, there is no limit on size dependent on lithography. It is therefore also possible for the widths in the $X(X_1)$-direction of the cell trenches 12*b* and the peripheral trenches 12*a* to be smaller than F.

Furthermore, according to this exemplary embodiment, the width in the $X_1$-direction of the cell silicon pillars 1*d* is F and the width in the X-direction of the peripheral silicon pillars 1*c* is 2F. This comes as a result of the width of the cell first openings 40*b* being 3F and the width of the peripheral first openings 40*a* being 4F at the stage in FIG. 3. For example, if the width of the cell first openings 40*b* is 2.5F and the thickness of the sacrificial film 10 is F, the width in the $X_1$-direction of the cell silicon pillars 1*d* may be set at 0.5F. Furthermore, if the width of the peripheral first openings 40*a* is 3F and the thickness of the sacrificial film 10 is F, the width in the X-direction of the peripheral silicon pillars 1*c* may be set at F. That is to say, the widths in the $X(X_1)$-direction of the cell trenches 12*b*, cell silicon pillars 1*d*, peripheral trenches 12*a* and peripheral silicon pillars 1*c* can be set to a smaller size than F without depending on lithography, by controlling the width of the first opening pattern formed on the first organic film 6 by the initial lithography and the thickness of the sacrificial film 10.

A mask film (not depicted) that covers the memory cell region 100 is then formed, after which n-type impurity such as arsenic is ion-implanted over the whole surface using an ion implantation method. As a result, a first lower diffusion layer 9*ac*, second lower diffusion layer 9*ad* and third lower diffusion layer 9*ae* are formed on the surface of the semiconductor substrate 1 corresponding to the bottom surfaces of the peripheral trenches 12*a*1, 12*a*2, 12*a*3. The mask film is removed after this.

Next, as shown in FIG. 10A and FIG. 10B, first and second gate insulating films 13*a*, 13*b* are formed in such a way as to cover the inner surfaces of the peripheral trenches 12*a* and cell trenches 12*b*, respectively. A silicon dioxide film or a silicon oxynitride film etc. which is formed by thermal oxidation of the surface of the silicon substrate 1 may be used as the first and second gate insulating films 13*a*, 13*b*, for example. A gate electrode material is then deposited over the whole surface in such a way as to cover the first and second gate insulating films 13*a*, 13*b* and to be embedded in the peripheral trenches 12*a* and cell trenches 12*b*. Specifically, a titanium nitride (TiN) single-layer film or a titanium nitride/tungsten (W) laminated film may be used as the gate electrode material, for example. The gate electrode material which is formed over the whole surface is then etched back so that the upper surface is excavated in such a way as to be positioned inside the trenches. In this exemplary embodiment, formation is carried out in such a way that the upper surface of the lower electrode material is disposed at a position in contact with the side surface of the silicon dioxide film 3.

As a result, a cell first gate electrode 14*ba* and a cell second gate electrode 14*bb* embedded in the cell trenches 12*b* provided in the silicon substrate 1 are formed in the cell active region 1*b*, and embedded wiring 14*b*' for element isolation is formed on the cell second element isolation regions 2*ca*, 2*cb*. Furthermore, a peripheral first gate electrode 14*a*1, peripheral second gate electrode 14*a*2 and peripheral third gate electrode 14*a*3 for a vertical transistor are formed inside the peripheral trenches 12*a*1, 12*a*2, 12*a*3, respectively, provided in the silicon substrate 1, in the peripheral active region 1*a*. The peripheral fourth gate electrode 14*a*4 is also formed simultaneously, but that is a gate electrode which does not contribute to the structure of the peripheral transistor. Such a structure is formed in this exemplary embodiment because two first openings 40*a* are formed inside the peripheral active region 1*a* at the stage in FIG. 3B. However, as shown in the third to fifth exemplary embodiments which will be described below, the peripheral fourth gate electrode 14*a*4 which is formed at the end in the X-direction can also be formed inside the peripheral element isolation region 2*a* by adjusting the position of the end of the peripheral active region 1*a* and the position of formation of the first openings.

Figure 10:
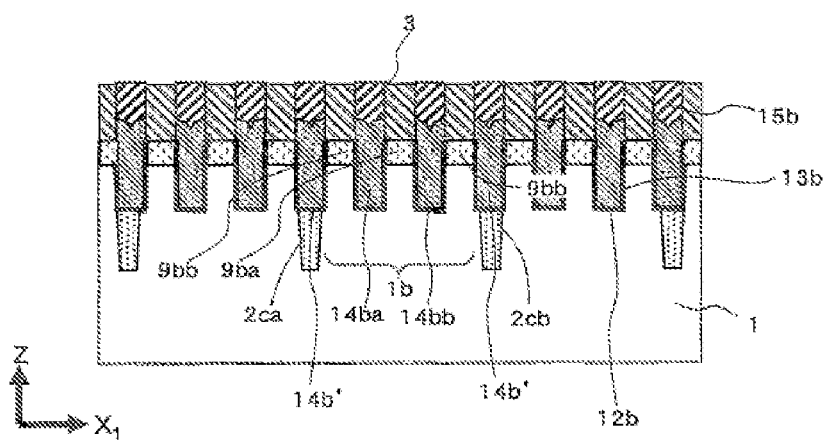
FIG. 10 is a diagram showing the method for producing the semiconductor device according to the first exemplary embodiment.
Figure 10:
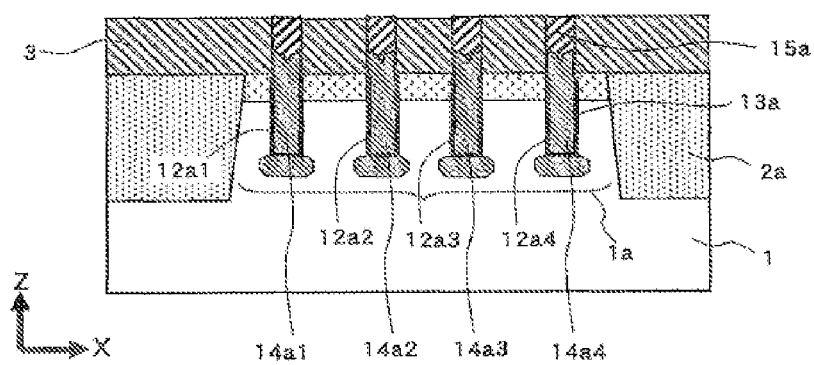
Figure 11:
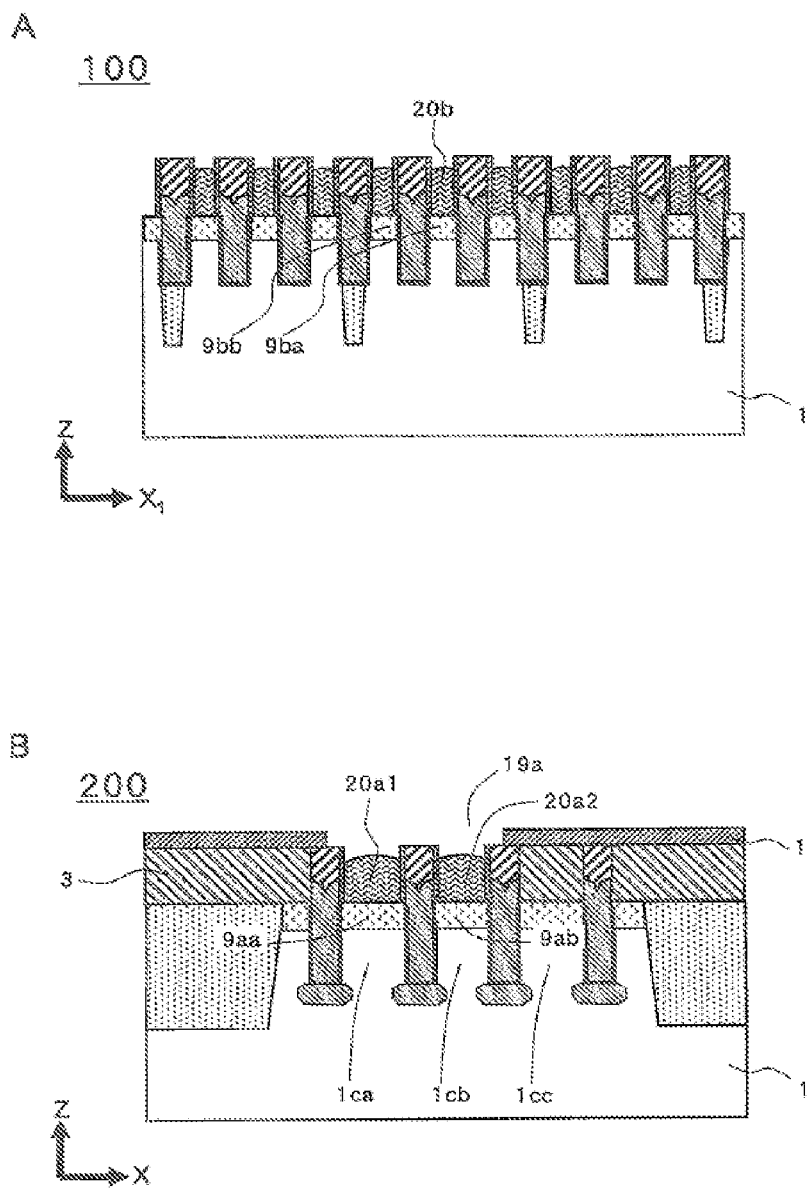
FIG. 11 is a diagram showing the method for producing the semiconductor device according to the first exemplary embodiment.

It should be noted that in FIG. 10, the upper surface of the etched-back laminated film has been etched back in such a way as to be at a higher level than the main surface of the silicon substrate 1, but additional etch-back may be performed only on the laminated film in the memory cell region so that the upper surface of the laminated film is at a lower level than the main surface of the silicon substrate 1 (preferably at a lower level than the bottom surfaces of the cell diffusion layers 9*ba*, 9*bb*).

A silicon nitride film is then formed over the whole surface of the silicon substrate 1 by means of CVD, after which said film is planarized by means of etch-back or CMP. As a result, cap insulating films 15*a*, 15*b* which cover the upper surfaces of the gate electrodes that have been excavated and are embedded in the trenches are formed. At this stage, the upper surfaces of the cap insulating films 15*a*, 15*b* and the upper surface of the silicon dioxide film 3 are flush and exposed.

Next, as shown in FIG. 11A and FIG. 11B, a silicon nitride film 19 is formed over the whole surface, after which a cover mask film 19 is formed by means of lithography and dry etching in such a way that the whole surface of the memory cell region 100 and the upper surfaces of the peripheral first silicon pillar 1*ca* and the peripheral second silicon pillar 1*cb* in which the vertical transistor in the peripheral circuit region 200 is formed are open. As a result, the cover mask film 19 having an opening 19*a* which exposes the upper surface of the silicon dioxide film 3 in part of the peripheral circuit region 200 is formed.

The silicon dioxide film 3 whereof the upper surface is exposed inside the memory cell region 100 and the peripheral circuit region 200 is then removed by means of wet etching employing a hydrofluoric acid-containing solution. As a result, the upper surfaces of the cell diffusion layers 9ba, 9bb positioned inside the memory cell region 100 are exposed, while the upper surfaces of the peripheral diffusion layers 9aa, 9ab positioned inside the opening 19a in the peripheral circuit region 200 are also exposed.

A silicon layer containing impurity is then formed by means of selective epitaxial growth on the surface of the silicon substrate 1 comprising the cell diffusion layers 9ba, 9bb and the peripheral diffusion layers 9aa, 9ab whereof the upper surfaces are exposed. Impurity may be introduced into the silicon layer by means of selective epitaxial growth employing a starting material gas that contains impurity, for example or impurity may be introduced by forming the silicon layer and then implanting impurity in the silicon layer. A cell upper contact plug 20b which is connected to the cell first diffusion layer 9ba and the cell second diffusion layer 9bb, and peripheral upper contact plugs 20a1, 20a2 which are connected to the first upper diffusion layer 9aa and the second upper diffusion layer 9ab positioned in the peripheral circuit region are formed as a result.

Figure 12:
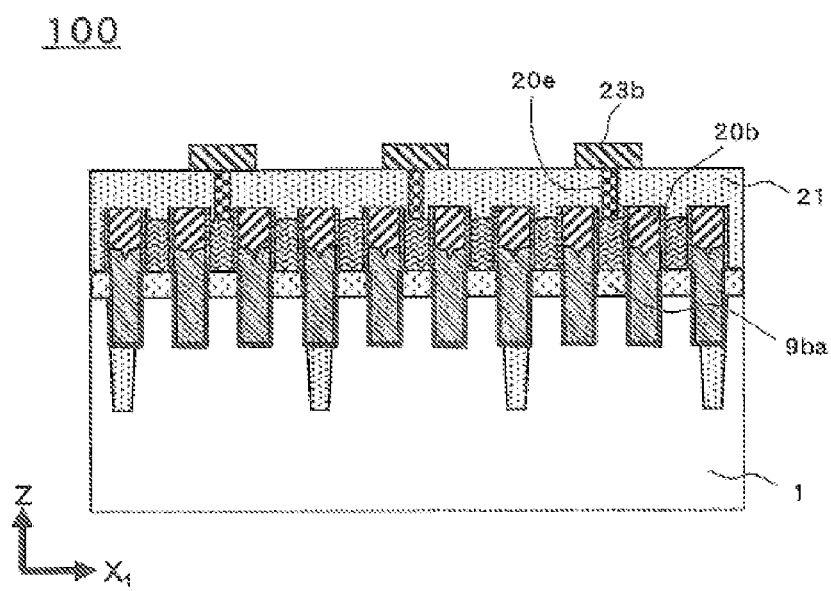
FIG. 12 is a diagram showing the method for producing the semiconductor device according to the first exemplary embodiment.

Next, as shown in FIG. 12 and FIG. 1B, a first interlayer insulating film 21 comprising a silicon dioxide film is formed over the whole surface of the silicon substrate 1 and then planarized. A bit contact plug 20e passing through the first interlayer insulating film 21 and connected to the cell upper contact plug 20b positioned above the cell first diffusion layer 9ba is then formed in the memory cell region, as shown in FIG. 12, using photolithography and dry etching. Furthermore, as shown in FIG. 1B, wiring contact plugs 20d1, 20d2 passing through the first interlayer insulating film 21 and connected to the first and second upper contact plugs 20a1, 20a2 are formed in the peripheral circuit region. A conductive film (e.g., a tungsten film) is then formed by means of sputtering over the whole surface of the first interlayer insulating film 21, after which the conductive film is patterned. As a result, a bit line 23b, peripheral first wiring 23a1 constituting source wiring, and peripheral second wiring 23a2 constituting drain wiring are formed in the memory cell region and the peripheral circuit region, respectively.

Next, as shown in FIG. 2B, a second interlayer insulating film 24 comprising a silicon dioxide film is formed over the whole surface of the silicon substrate 1 and then planarized.

A capacitance contact plug 20c which passes through the first interlayer insulating film 21 and the second interlayer insulating film 24 and is connected to the cell upper contact plug 20b positioned above the cell second diffusion layer is then formed in the memory cell region. A capacitor comprising a lower electrode 29a having a crown structure, a capacitance insulating film which is not depicted, and an upper electrode 29b is then formed by means of a known method on the second interlayer insulating film 24.

A fourth interlayer insulating film (not depicted) comprising a silicon dioxide film or the like is then formed in such a way as to cover the capacitor 29. A wiring contact passing through the fourth interlayer insulating film and reaching the upper electrode 29b, wiring connected to the wiring contact, and a protective insulating film for covering the wiring (none of which is depicted) are formed using photolithography and dry etching. The DRAM memory cell according to this exemplary embodiment is completed as a result.

Second Exemplary Embodiment

In the first exemplary embodiment, in the steps in FIG. 11A and FIG. 11B, the cell upper contact plug 20b connected to the cell first diffusion layer 9ba and the cell second diffusion layer 9bb, and the peripheral upper contact plugs 20a1, 20a2 connected to the first upper diffusion layer 9aa and the second upper diffusion layer 9ab positioned in the peripheral circuit region are formed by a silicon film using selective epitaxial growth. In this exemplary embodiment, a method for producing a semiconductor device is described in which the upper contact plugs are not formed so the production process can be simplified.

First of all, when the gate electrode material formed over the whole surface embedded in the trenches A and B is etched back and excavated at the stage in FIG. 10A and FIG. 10B, formation is carried out in such a way that the upper surface is positioned at the same depth as the bottom surfaces of the cell diffusion layers 9ba, 9bb and the peripheral upper diffusion layers 9aa, 9ab, as shown in FIG. 13A and FIG. 13B. As a result, the cell gate electrodes (gate electrodes B) 14ba, 14bb, the embedded wiring 14b' for element isolation, and peripheral gate electrodes (gate electrodes A) 14a1, 14a2, 14a3, 14a4 are simultaneously formed. In addition, after the silicon nitride film has been formed over the whole surface, the whole surface is etched back in order to form the cap insulating films 15b, 15a in such a way as to cover the upper surfaces of the gate electrodes and to be embedded in the upper part of the trenches. At this stage, the upper surface of the silicon dioxide film 3 employed as a mask for trench formation is flush with the upper surfaces of the cap insulating films 15b, 15a.

Next, as shown in FIG. 14A and FIG. 14B, part of the silicon dioxide film 3 is etched by means of photolithography and anisotropic dry etching. As a result, bit contact holes 23ba exposing the upper surface of the cell first diffusion layer 9ba are formed in the memory cell region 100, and wiring contact holes 12aa exposing the upper surfaces of the peripheral upper diffusion layers 9aa, 9ab are simultaneously formed in the peripheral circuit region 200.

Next, as shown in FIG. 15A and FIG. 15B, a metal silicide film, a barrier film such as a titanium nitride film, and a conductive film comprising a tungsten film are formed by means of CVD or the like over the whole surface in such a way as to fill the contact holes. The conductive film is then patterned using photolithography and anisotropic dry etching. As a result, a bit contact plug 20e and a bit line 23b filling the bit contact holes 23ba are simultaneously formed in the memory cell region 100, while wiring contact plugs 20d1, 20d2 filling the wiring contact holes 12aa and peripheral first wiring 23a1 and peripheral second wiring 23a2 are also formed in the peripheral circuit region 200.

Here, the wiring corresponding to the contact plugs is formed simultaneously from the same material, but this is not limiting. The contact plugs may first of all be formed by an n-type impurity-containing silicon film, after which the wiring may be formed thereon in a separate step.

After this, in the same way as in the first exemplary embodiment, a second interlayer insulating film 24 is formed over the whole surface, after which a capacitance contact plug 20c is formed and a capacitor 29 is formed. According to this exemplary embodiment, the upper surfaces of the gate electrodes embedded in the gate trenches are excavated as far as inside the semiconductor substrate, i.e. as far as the same position as the bottom surfaces of the diffusion layers, so it is possible to avoid the risk of short-circuiting of the gate electrodes with the bit contact plugs and wiring contact plugs. As a result, the step in which the cover insulating film 19 is formed, the step in which the contact holes are formed, the step in which the side wall insulating film 16 is formed, the step in which the upper contact plugs are formed by means of selective epitaxial growth, and the step in which the interlayer insulating film 21 is formed become unnecessary and can be omitted. The process can therefore be simplified.

Third Exemplary Embodiment

Figure 16:
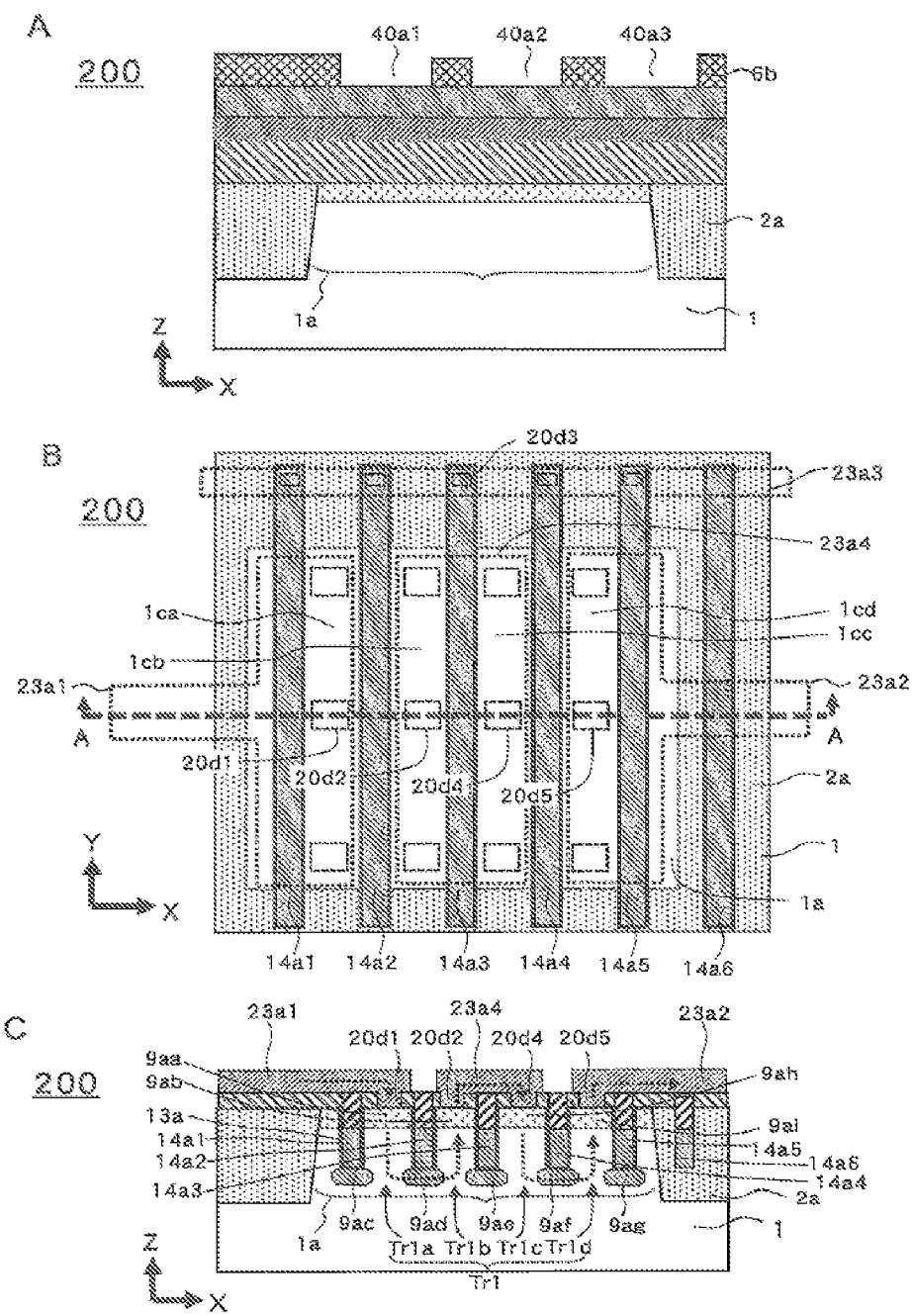
FIG. 16 is a diagram showing a semiconductor device and a method for producing same according to a third exemplary embodiment.

In this exemplary embodiment, an arrangement in which a plurality of vertical transistors are further combined with the peripheral transistors described in the first and second exemplary embodiments will be described with the aid of FIG. 16. The placement etc. of the constituent elements is the same as in the second exemplary embodiment. In FIG. 16, the "B" diagram is a plan view and the "A" diagram and the "C" diagram are views in cross section on the line A-A in the "B" diagram.

Three peripheral first openings 40a1, 40a2, 40a3 are formed at the stage of FIG. 3B in the first exemplary embodiment. FIG. 16A is a view in cross section showing this state. It should be noted that in the present exemplary embodiment, the first opening 40a3 is disposed at the boundary portion lying across the peripheral active region 1a and the peripheral element isolation region 2a. As a result, a peripheral sixth gate electrode 14a6 which is formed at a subsequent stage is positioned inside the peripheral element isolation region 2a.

Figure 13:
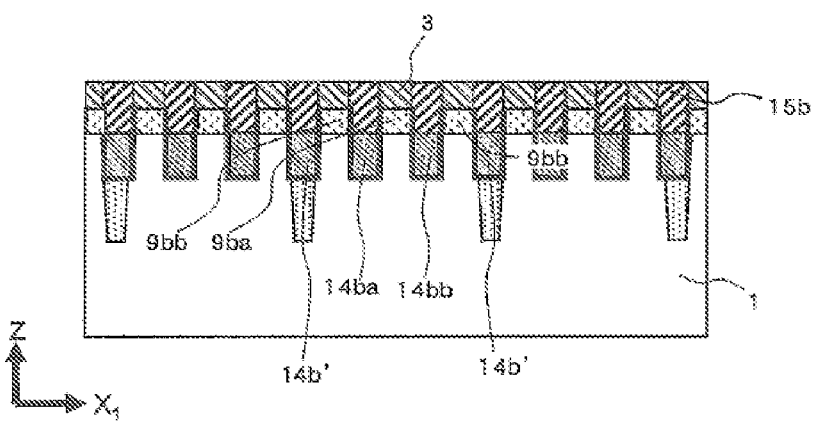
FIG. 13 is a diagram showing a method for producing a semiconductor device according to a second exemplary embodiment.
Figure 13:
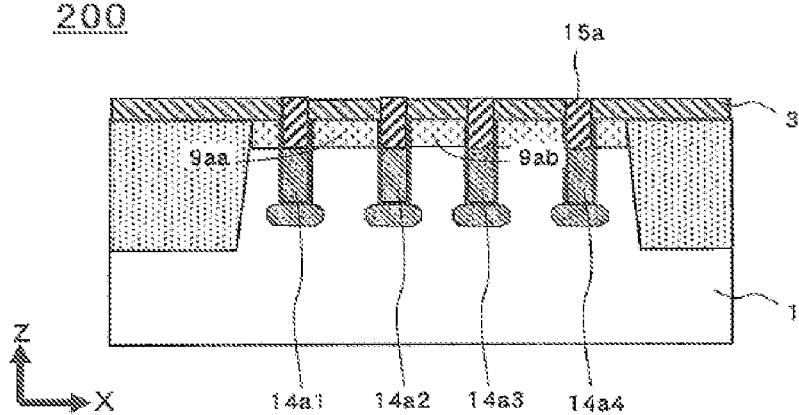
Figure 14:
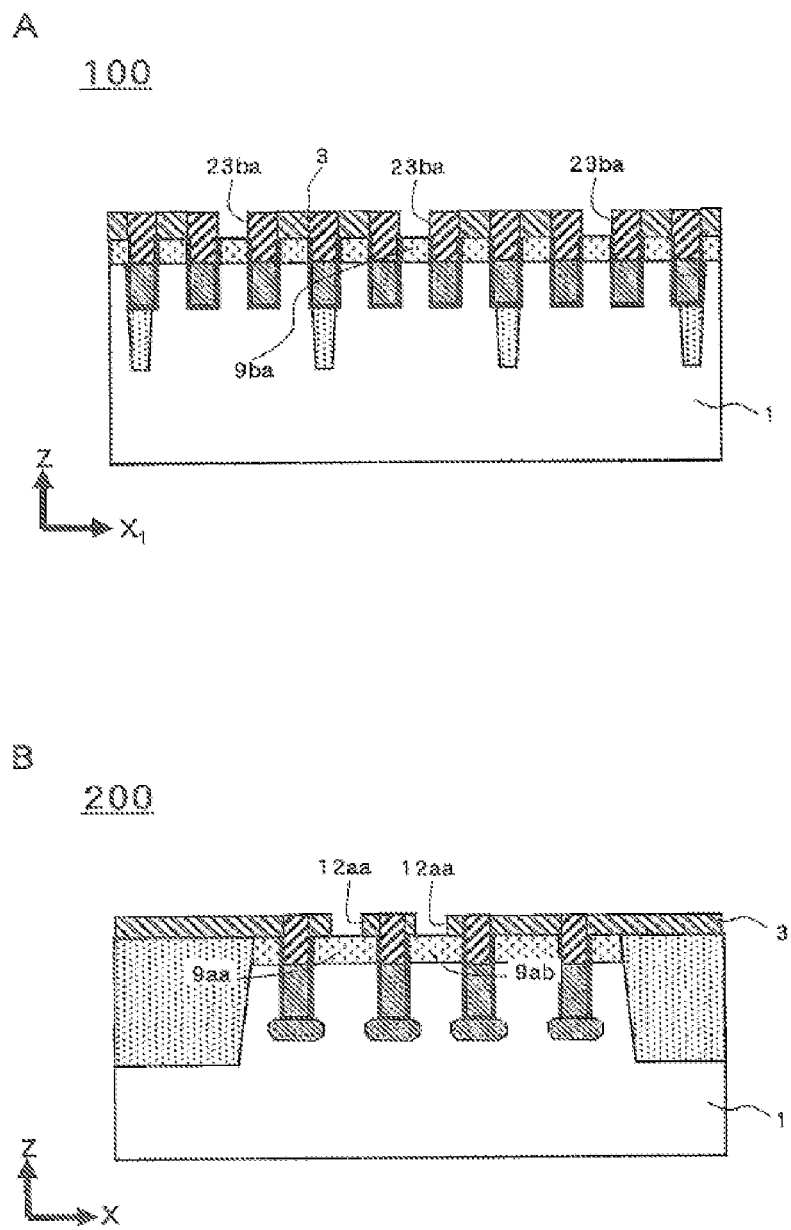
FIG. 14 is a diagram showing the method for producing the semiconductor device according to the second exemplary embodiment.
Figure 15:
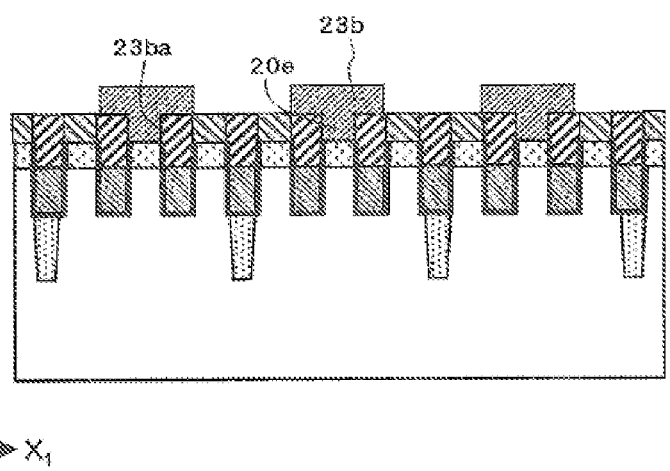
FIG. 15 is a diagram showing the method for producing the semiconductor device according to the second exemplary embodiment.
Figure 15:
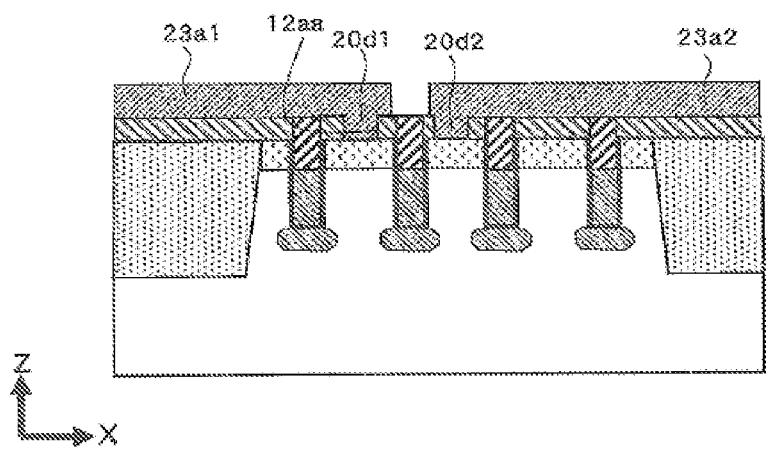

The steps from FIG. 4 to FIG. 10 are then performed in the same way as in the first exemplary embodiment, after which the steps in FIG. 13 to FIG. 15 are performed in the same way as in the second exemplary embodiment. That is to say, the basic structure of the individual vertical transistors is the same as in the second exemplary embodiment.

As shown in FIG. 16A, FIG. 16B and FIG. 16C, in a peripheral transistor Tr1 according to this exemplary embodiment, a mask pattern 6b including the three peripheral first openings 40a1, 40a2, 40a3 is formed on the peripheral active region 1a which is defined by the peripheral element isolation region 2a, whereby four vertical transistors Tr1a, Tr1b, Tr1c, Tr1d which are formed inside the peripheral active region 1a are formed in the peripheral circuit region 200. That is to say, the three peripheral first openings 40a are formed, whereby five peripheral trenches (trenches A) which are adjacent in the X-direction are formed inside the peripheral active region 1a, and the peripheral first gate electrode 14a1 to a peripheral fifth gate electrode 14a5 which are embedded in the peripheral trenches are provided. The peripheral sixth gate electrode 14a6 is formed inside the peripheral element isolation region 2a and does not function as a transistor gate electrode.

Furthermore, by forming the peripheral trenches, four peripheral silicon pillars 1ca, 1cb, 1cc, 1cd are provided inside the peripheral active region 1a. The peripheral silicon pillars 1ca, 1cb, 1cc, 1cd form a channel for each vertical transistor.

That is to say, the first vertical transistor Tr1a comprises: the peripheral first silicon pillar 1ca; a peripheral gate insulating film (first gate insulating film) 13a; two peripheral gate electrodes which are facing in the X-direction, namely the peripheral first gate electrode (electric A) 14a1 and the peripheral second gate electrode (gate electrode A) 14a2; an upper diffusion layer 9aa; and lower diffusion layers 9ac and 9ad. The other second vertical transistor Tr1b, third vertical transistor Tr1c, and fourth vertical transistor Tr1d have the same structure. All of the vertical transistors also have a double gate structure in which a gate electrode is disposed on both side surfaces in the X-direction of a silicon pillar forming a channel. All of the gate electrodes lead out to the peripheral element isolation region 2a and are connected to the same gate power supply wiring 23a3 by way of a gate power supply contact plug 20d3.

In this exemplary embodiment, the upper layer wiring connected to each vertical transistor is arranged in the following manner. Peripheral first wiring 23a1 constituting source wiring is provided at the first vertical transistor Tr1a with an upper contact plug 20d1 interposed. Peripheral second wiring 23a2 constituting drain wiring is provided at the fourth vertical transistor Tr1d with an upper contact plug 20d5 interposed. Meanwhile, the second vertical transistor Tr1b and the third vertical transistor Tr1c are connected to peripheral third wiring 23a4 by way of upper contact plugs 20d2 and 20d4, respectively. That is to say, the four vertical transistors form a single peripheral transistor Tr1 connected in series. When a relatively high voltage is applied to the peripheral first wiring 23a1 than to the peripheral second wiring 23a2, current flows as shown by the dotted-line arrows in FIG. 16C. This arrangement is equivalent to one transistor which effectively has an increased channel length, and makes it possible to increase the withstand voltage between the source/drain.

In this exemplary embodiment, an example was described in which the four double-gate vertical transistors are connected in series, but it is possible to achieve more serial connections provided that the number of peripheral first openings 40a in FIG. 16A is increased.

Fourth Exemplary Embodiment

In this exemplary embodiment, an arrangement in which a shared gate electrode is provided for two peripheral transistors disposed in separate peripheral active regions will be described with the aid of the plan view in FIG. 17. The basic structure of the vertical transistors is the same as in the second exemplary embodiment, as in the abovementioned exemplary embodiment.

Figure 17:
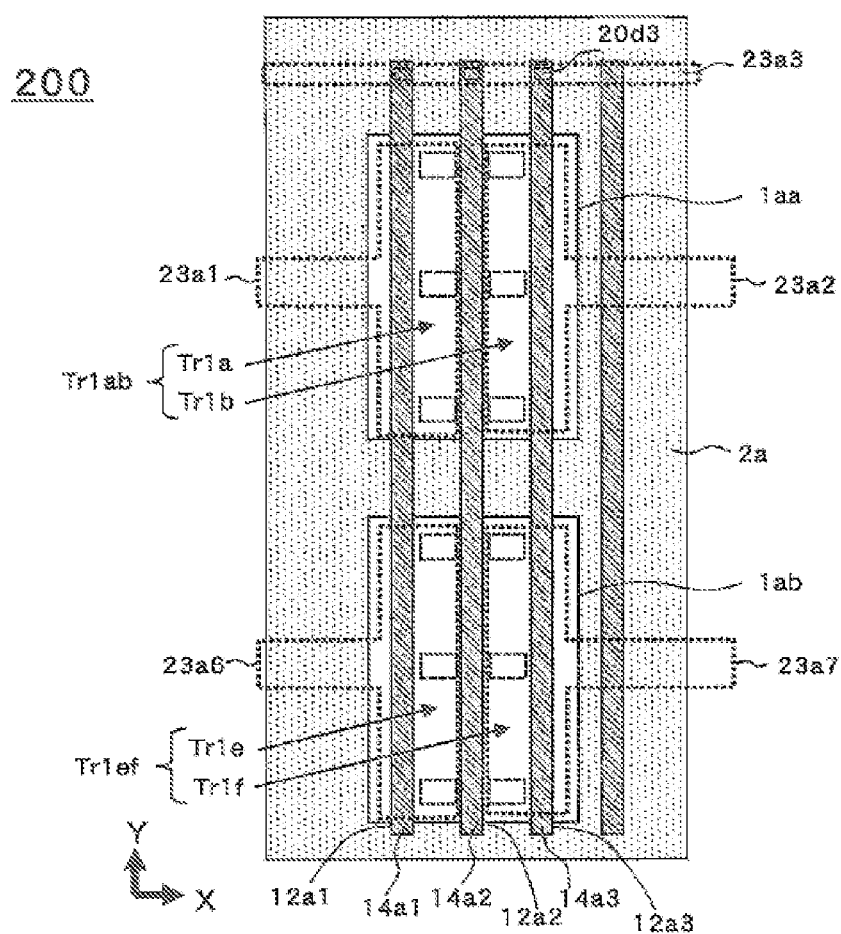
FIG. 17 is a diagram showing a semiconductor device according to a fourth exemplary embodiment.

As shown in FIG. 17, a peripheral active region 1aa and a peripheral active region 1ab defined by a peripheral element isolation region 2a are arranged in the Y-direction. A peripheral first transistor Tr1ab comprising a first vertical transistor Tr1a and a second vertical transistor Tr1b is disposed in the peripheral active region 1aa. Peripheral first wiring 23a1 and peripheral second wiring 23a2 are independently connected to the peripheral first transistor Tr1a, Tr1b thereby forming a single series transistor.

Furthermore, a peripheral second transistor Tr1ef comprising a third vertical transistor Tr1e and a fourth vertical transistor Tr1f is disposed in the peripheral active region 1ab. Peripheral third wiring 23a6 and peripheral fourth wiring 23a7 are independently connected to the peripheral second transistor Tr1e, Tr1f thereby forming a single series transistor.

A peripheral first trench 12a1, peripheral second trench 12a2, and peripheral third trench 12a3 extend in the Y-direction inside the peripheral active region 1aa and the peripheral active region 1ab. First to third peripheral gate electrodes 14a1, 14a2a3 provided in the respective trenches 12a1, 12a2, 12a3 constitute gate electrodes shared by the peripheral first transistor Tr1ab and the peripheral second transistor Tr1ef. That is to say, the first and second peripheral gate electrodes 14a1, 14a2 are shared by the first vertical transistor Tr1a and the third vertical transistor Tr1e which are arranged in the Y-direction, as common gate electrodes. Furthermore, the second and third peripheral gate electrodes 14a2, 14a3 are shared by the second vertical transistor Tr1b and the fourth vertical transistor Tr1f which are arranged in the Y-direction, as common gate electrodes. The gate electrodes are connected to the same gate power supply wiring 23a3 by way of gate power supply contact plugs 20d3.

As described in the first exemplary embodiment, this exemplary embodiment also makes use of gate electrodes which are embedded in peripheral trenches, so even in the case of separate vertical transistors having a double gate structure which are arranged in different peripheral active regions, it is readily possible for gate electrodes to be shared and simultaneous operation is possible.

It is difficult to achieve the arrangement of this exemplary embodiment using a method in which the gate electrodes are formed using etch-back, as described in the patent document.

Fifth Exemplary Embodiment

Figure 18:
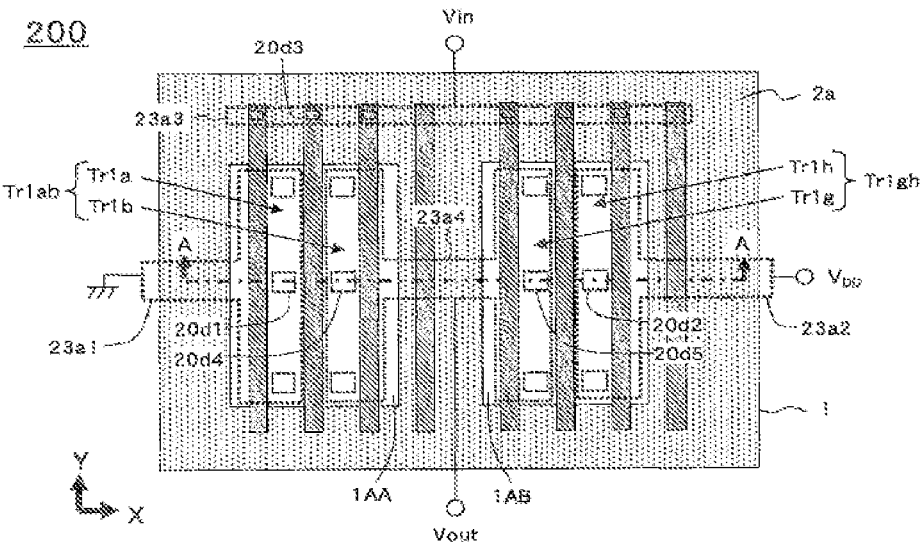
FIG. 18 is a diagram showing a semiconductor device according to a fifth exemplary embodiment.
Figure 18:
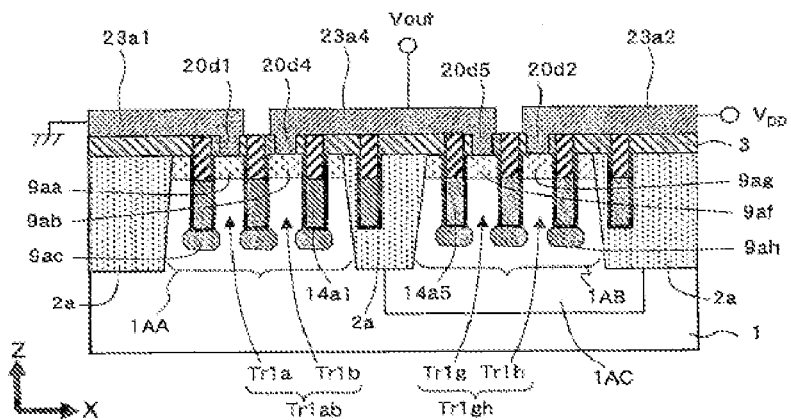

In this exemplary embodiment, an example in which a complementary circuit (Complementary MOS Circuit: CMOS) is formed by combining a p-channel-type transistor and an n-channel-type transistor will be described with the aid of FIG. 18. The "A" diagram is a plan view, and the "B" diagram is a view in cross section on the line A-A in the "A" diagram.

As shown in FIG. 18A and FIG. 18B, This exemplary embodiment comprises a p-type peripheral active region 1AA disposed inside a p-type single-crystal silicon substrate 1, and an n-type peripheral active region 1AB disposed inside an n-well substrate 1AC provided in a separate region from the peripheral active region 1AA. The n-well substrate 1AC is formed by forming a peripheral element isolation region 2a, and then using ion implantation in order to implant n-type impurity such as phosphorus.

An n-channel-type MOS transistor is provided in the same way as in the abovementioned exemplary embodiment inside the p-type peripheral active region 1AA. That is to say, an n-type peripheral first transistor Tr1ab formed by both an n-type peripheral first vertical transistor Tr1a and a peripheral second vertical transistor Tr1b is provided.

Meanwhile, a p-channel-type MOS transistor is disposed inside the n-type peripheral active region 1AB. That is to say, a p-type peripheral second transistor Tr1gh formed by both a p-type peripheral third vertical transistor Tr1g and a peripheral fourth vertical transistor Tr1h is provided.

Upper diffusion layers 9aa, 9ab and a lower diffusion layer 9ac forming part of the n-type peripheral first transistor Tr1ab are formed by silicon which contains n-type impurity such as arsenic or phosphorus. Furthermore, a gate electrode 14a1 is formed by an n-type impurity-containing silicon film or by the metal film described in the first exemplary embodiment. Meanwhile, upper diffusion layers 9af, 9ag and a lower diffusion layer 9ah forming part of the p-type peripheral second transistor Tr1gh are formed by silicon which contains p-type impurity such as boron. Furthermore, a gate electrode 14a5 is formed by a p-type impurity-containing silicon film or by the metal film described in the first exemplary embodiment. The upper diffusion layers 9aa, 9ab and the upper diffusion layers 9af, 9ag cannot be simultaneously formed, so they are formed in separate ion implantation steps employing separate mask films. Furthermore, when silicon films containing different impurities are used for the gate electrodes, these are formed separately from the gate trench formation step. That is to say, the cell trenches in the memory cell and the peripheral trenches forming part of the n-type peripheral first transistor Tr1ab are formed to start with, the n-type impurity-containing silicon film is embedded by means of CVD and the n-type gate electrode is formed, after which a hard mask film which opens the peripheral active region 1AB is formed, and a step of forming the peripheral trenches forming part of the p-type peripheral second transistor Tr1gh and of embedding a boron-containing silicon film are implemented.

Peripheral first wiring 23a1 is disposed on the n-type peripheral first vertical transistor Tr1a with a wiring contact plug 20d1 interposed, for example at ground potential. Furthermore, peripheral second wiring 23a2 is disposed on the p-type peripheral fourth vertical transistor Tr1h with a wiring contact plug 20d2 interposed, and a power source voltage $V_{DD}$ is applied, for example. Meanwhile, peripheral third wiring 23a4 constituting common wiring is connected to the n-type peripheral second vertical transistor Tr1b and p-type peripheral third vertical transistor Tr1g with wiring contact plugs 20d4 and 20d5 interposed. The peripheral third wiring 23a4 is connected to an output terminal Vout. Furthermore, the gate electrodes are connected to gate power supply wiring 23a3 by way of gate power supply contact plugs 20d3. The gate power supply wiring 23a3 is connected to an input terminal Vin.

By virtue of the abovementioned arrangement, the n-type peripheral first transistor Tr1ab and p-type peripheral second transistor Tr1gh form a CMOS circuit, and a basic inverter circuit is formed. That is to say, when "1" is input at the input terminal Vin, "0" is output at the output terminal; conversely, when "0" is input, "1" is output. According to this exemplary embodiment, a CMOS inverter circuit can be constructed by means of the n-type peripheral first transistor Tr1ab and the p-type peripheral second transistor Tr1gh which both have a double gate structure.

KEY TO SYMBOLS

1 . . . Semiconductor substrate
1a, 1aa, 1ab, 1AA, 1AB . . . Peripheral active region (first active region)
1a1, 1a2 . . . Side of peripheral active region
1aj, 1af, 1ag, 1ah, 1ai, 1ak . . . Side surface of peripheral trench
1AC . . . n-well substrate
1b . . . Cell active region (second active region)
1c, 1ca, 1cb, 1cc, 1cd, 1ce . . . Peripheral silicon pillar (semiconductor pillar)
1da, 1db, 1dc . . . Cell silicon pillar cell
1e . . . Upper surface of silicon substrate
2a . . . Peripheral element isolation region
2b . . . Cell first element isolation region
2ca, 2cb . . . Cell second element isolation region
3 . . . Silicon dioxide film
4 . . . Silicon nitride film
5 . . . Amorphous carbon film
5A . . . Hard mask film
6 . . . First organic film
6a, 6b . . . Mask pattern
9a . . . Peripheral diffusion layer
9aa, 9ab, 9ah, 9ai . . . Upper diffusion layer
9ac, 9ad, 9ae, 9af, 9ag . . . Lower diffusion layer
9b . . . Cell diffusion layer
9ba . . . Cell first diffusion layer (bit line diffusion layer region)
9bb . . . Cell second diffusion layer (capacitance diffusion layer region)
10 . . . Sacrificial film
10a, 10aa, 10ab . . . Peripheral side-wall section
10b, 10ba, 10bb . . . Cell side-wall section 11 . . . Second organic film
12a, 12a1, 12a2, 12a3, 12a4 . . . Peripheral trench (trench A)
12aa . . . Wiring contact hole
12b, 12ba, 12bb . . . Cell trench (trench B)
13a . . . Peripheral gate insulating film (first gate insulating film)
13b . . . Cell gate insulating film (second gate insulating film)
14a, 14a1, 14a2, 14a3, 14a4, 14a5, 14a6 . . . Peripheral gate electrode (gate electrode A)
14b, 14ba, 14bb . . . Cell gate electrode (gate electrode B)
14b' . . . Embedded wiring
15 . . . Silicon nitride film
15a . . . Peripheral cap insulating film
15b . . . Cell cap insulating film
16 . . . Side wall insulating film
19 . . . Silicon nitride film
19a . . . Opening
20a, 20a1, 20a2 . . . Peripheral upper contact plug (first contact plug)
20b . . . Cell upper contact plug
20c . . . Capacitance contact plug
20d1 . . . 20d2 . . . Wiring contact plug
20d3 . . . Gate contact section
20d4, 20d5 . . . Upper contact plug
20e . . . Bit contact plug
21 . . . First interlayer insulating film
23a1, 23a2, 23a4, 23a6, 23a7 . . . Peripheral wiring
23a3 . . . Gate power supply wiring
23b . . . Bit line
23ba . . . Bit contact hole
24 . . . Second interlayer insulating film
29 . . . Capacitor
29a . . . Lower electrode
29b . . . Upper electrode
40a, 40aa, 40ab, 40ac, 40a1, 40a2, 40a3 . . . Peripheral opening
40b, 40ba, 40bb . . . Cell opening
100 . . . Memory cell region
200 . . . Peripheral circuit region
Tr1, Tr1a, Tr1b, Tr1ab, Tr1c, Tr1d, Tr1e, Tr1f, Tr1ef, Tr1g, Tr1h, Tr1gh . . . Peripheral transistor (first transistor)
Tr2a, Tr2b . . . Cell transistor

What is claimed is:

1. A semiconductor device comprising:
a first active region disposed inside a semiconductor substrate;
a first trench disposed inside the first active region and having a first side surface and a second side surface extending in parallel in a first direction, wherein the first direction is a vertical direction extending perpendicularly from a main surface of the semiconductor substrate;
a second trench disposed inside the first active region and having a third side surface and a fourth side surface extending in parallel in the first direction;
a third trench disposed inside the first active region and having a fifth side surface and a sixth side surface extending in parallel in the first direction;
a first gate electrode embedded in the first trench;
a second gate electrode embedded in the second trench;
a third gate electrode embedded in the third trench;
a first semiconductor pillar positioned between the first trench and the second trench and sharing the second side surface and the third side surface;
a second semiconductor pillar positioned between the second trench and the third trench and sharing the fourth side surface and the fifth side surface, the first semiconductor pillar forming a first vertical transistor in which the first gate electrode and the second gate electrode form a first double gate electrode, the second semiconductor pillar forming a second vertical transistor in which the second gate electrode and the third gate electrode form a second double gate electrode, and the second gate electrode being shared by the first vertical transistor and the second vertical transistor;
wherein, when seen in plan view, a width of the first and second semiconductor pillars in the first direction is 2-20 times the width in a second direction orthogonal to the first direction; and the first, second and the third gate electrodes are separated from each other and extend parallel in the first direction along side surfaces of the corresponding semiconductor pillar without surrounding a whole periphery of the corresponding semiconductor pillar.

2. The semiconductor device of claim 1 comprising:
a first upper diffusion layer provided at the upper part of the first semiconductor pillar;
a second upper diffusion layer provided at the upper part of the second semiconductor pillar;
a second lower diffusion layer provided inside the first active region and positioned below the second trench;
first wiring electrically connected to the first upper diffusion layer; and
second wiring electrically connected to the second upper diffusion layer, the second lower diffusion layer being shared by the first vertical transistor and the second vertical transistor, and the first vertical transistor and the second vertical transistor being connected in series.

3. The semiconductor device of claim 1, wherein the upper surfaces of the first to third gate electrodes are at a higher level than the main surface of the semiconductor substrate.

4. The semiconductor device of claim 2, wherein the upper surfaces of the first to third gate electrodes are at substantially a same vertical position as the bottom surface of the first and second upper diffusion layers.

5. The semiconductor device of claim 1, comprising:
a second active region;
a fourth trench extending in the first direction inside the second active region;
a fourth gate electrode embedded in the fourth trench; and
a pair of cell diffusion layers provided in regions on both sides of the fourth trench, within the second active region.

6. The semiconductor device of claim 5, comprising a capacitor which is electrically connected to either one of the pair of cell diffusion layers.

7. A semiconductor device having a first region and a second region, wherein the first region is provided with:
a first active region comprising a semiconductor; three or more trenches extending in a first direction inside the first active region~wherein the first direction is a vertical direction extending perpendicularly from a main surface of a semiconductor substrate; and
a plurality of vertical transistors comprising:
two first gate insulating films and two gate electrodes provided in succession on inner surfaces surface of adjacent the three or more trenches, a first semiconductor pillar which is formed by the first active region positioned between adjacent the three or more trenches, an upper diffusion layer provided at an upper part of the first semiconductor pillar, and two lower diffusion layers which are provided inside the first active region positioned below the three or more adjacent trenches;

the second region is provided with a cell transistor comprising:

a second active region which extends in a third direction intersecting the first direction and comprises a semiconductor, wherein the third direction is a horizontal direction;

a trench which extends in the first direction inside the second active region;

a second gate insulating film and a first gate electrode which are provided in succession on the inner surface of the trench, a second semiconductor pillar which is formed by the second active region; and a pair of cell diffusion layers provided at the upper part inside the second active region on either side of the trench, and a second gate electrode of the two gate electrodes is positioned between adjacent vertical transistors and shared by adjacent vertical transistors;

wherein, when seen in plan view, a width of the first and second semiconductor pillars in the first direction is 2-20 times the width in a second direction orthogonal to the first direction; and the first and two gate electrodes are separated from each other and extend parallel in the first direction along side surfaces of the corresponding semiconductor pillar without surrounding a whole periphery of the corresponding semiconductor pillar.

* * * * *